(12) United States Patent
Tan

(10) Patent No.: US 9,660,122 B2
(45) Date of Patent: May 23, 2017

(54) COMPACT LCPV SOLAR ELECTRIC GENERATOR

(71) Applicant: Raymond Tan, Toronto (CA)

(72) Inventor: Raymond Tan, Toronto (CA)

(*) Notice: Subject to any disclaimer, the term of this patent is extended or adjusted under 35 U.S.C. 154(b) by 146 days.

(21) Appl. No.: 14/120,672

(22) Filed: Jun. 16, 2014

(65) Prior Publication Data

US 2014/0338724 A1 Nov. 20, 2014

Related U.S. Application Data

(63) Continuation-in-part of application No. 12/702,561, filed on Feb. 9, 2010, now abandoned.

(51) Int. Cl.

| | |
|---|---|
| *H01L 31/00* | (2006.01) |
| *H01L 31/042* | (2014.01) |
| *H02N 6/00* | (2006.01) |
| *H01L 31/052* | (2014.01) |
| *F24J 2/08* | (2006.01) |
| *F24J 2/10* | (2006.01) |

(Continued)

(52) U.S. Cl.
CPC .......... *H01L 31/0524* (2013.01); *F24J 2/085* (2013.01); *F24J 2/10* (2013.01); *F24J 2/5417* (2013.01); *G02B 19/0042* (2013.01); *H01L 31/0543* (2014.12); *H01L 31/0547* (2014.12); *H02S 20/32* (2014.12); *F24J 2/4609* (2013.01); *F24J 2/4621* (2013.01); *G02B 19/0028* (2013.01); *Y02E 10/43* (2013.01); *Y02E 10/47* (2013.01); *Y02E 10/52* (2013.01)

(58) Field of Classification Search
CPC ............. H01L 31/0524; H01L 31/0547; H01L 31/0543; F24J 2/085; F24J 2/10; F24J 2/5417; F24J 2/4609; F24J 2/4621; G02B 19/0042; G02B 19/0028; H02S 20/32; Y02E 10/43; Y02E 10/47; Y02E 10/52

USPC .................................................. 136/246, 257
See application file for complete search history.

(56) References Cited

U.S. PATENT DOCUMENTS

| | | | | |
|---|---|---|---|---|
| 5,118,361 | A * | 6/1992 | Fraas | H01L 31/05 136/244 |
| 2009/0272425 | A1* | 11/2009 | Green | F24J 2/07 136/246 |

* cited by examiner

*Primary Examiner* — Tamir Ayad

(57) ABSTRACT

A compact low concentration photovoltaic (LCPV) apparatus totally enclosed in a protective clear dome against harsh environment without active cooling. A conical mirror reflector, a circular lens refractor and a planar circular crystalline silicon photovoltaic solar panel rotate simultaneously inside the dome to concentrate sun rays and instantly produce electricity. The mirror increases electrical current three times and the lens increases one time for total four times using low overall concentration of five to twenty times sun. The lens is offset from the plane parallel to the photovoltaic solar panel, while the panels forming the mirror are angled offset to a center axis perpendicular to the solar panel. The optical assembly and solar panel are mounted in a conical aluminum cage which is pivoted from a rotary turntable for the daily azimuth and altitude rotations. The dual axis movements consist of irregular intermittent increments of less than one second "on time" and less than two minutes "off time" while following the sun path. The electrical power produced is at least two times more than from fixed conventional crystalline silicon solar panel occupying the same planar surface area. LCPV dual tracking systems offer reduced electricity generation costs, reduced installation costs and increased flexibility in deployment.

10 Claims, 29 Drawing Sheets

(51) Int. Cl.
*F24J 2/54* (2006.01)
*H01L 31/054* (2014.01)
*G02B 19/00* (2006.01)
*H02S 20/32* (2014.01)
*F24J 2/46* (2006.01)

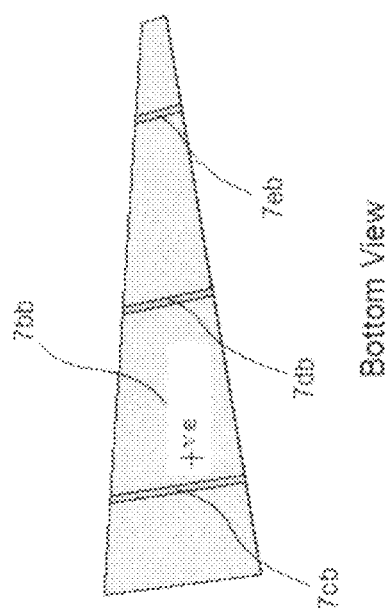
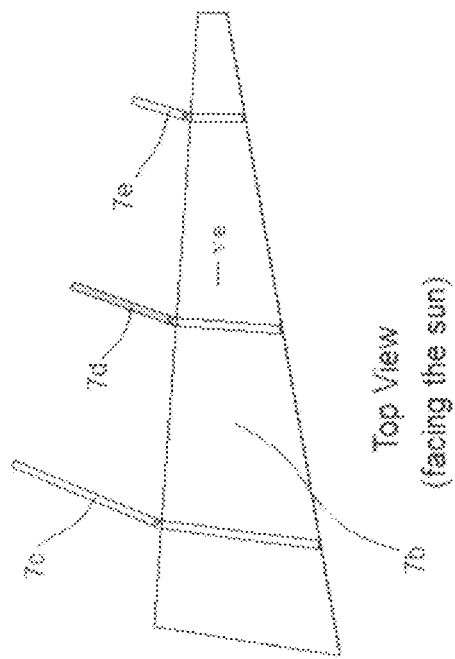
Fig. 10a

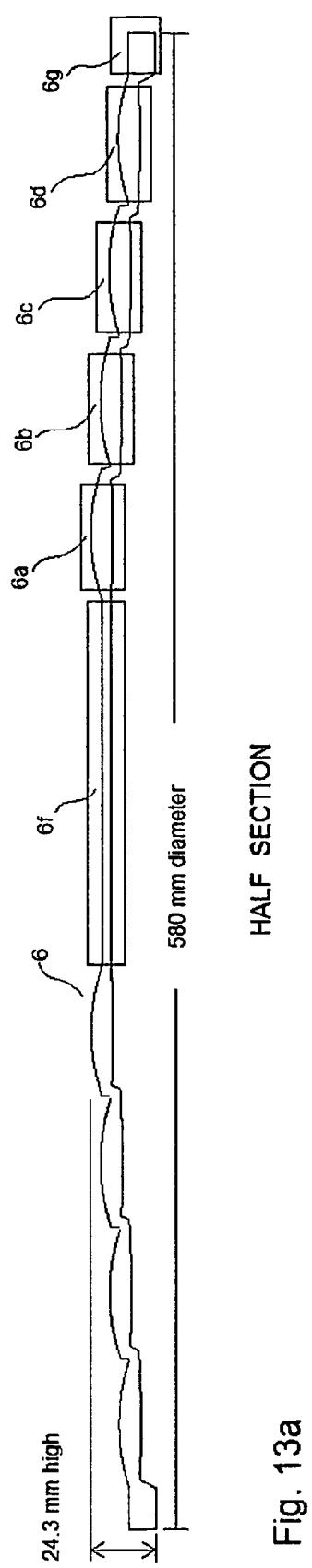

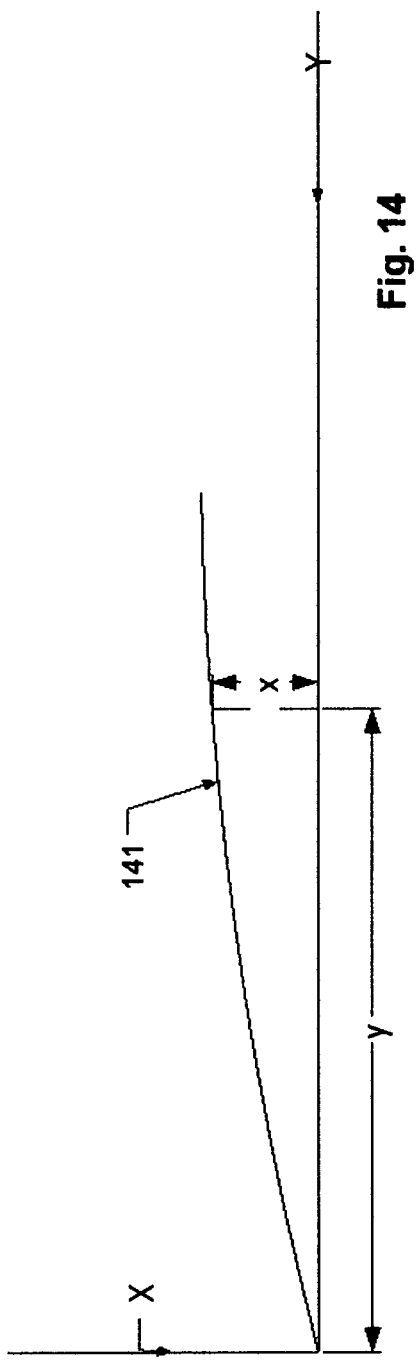

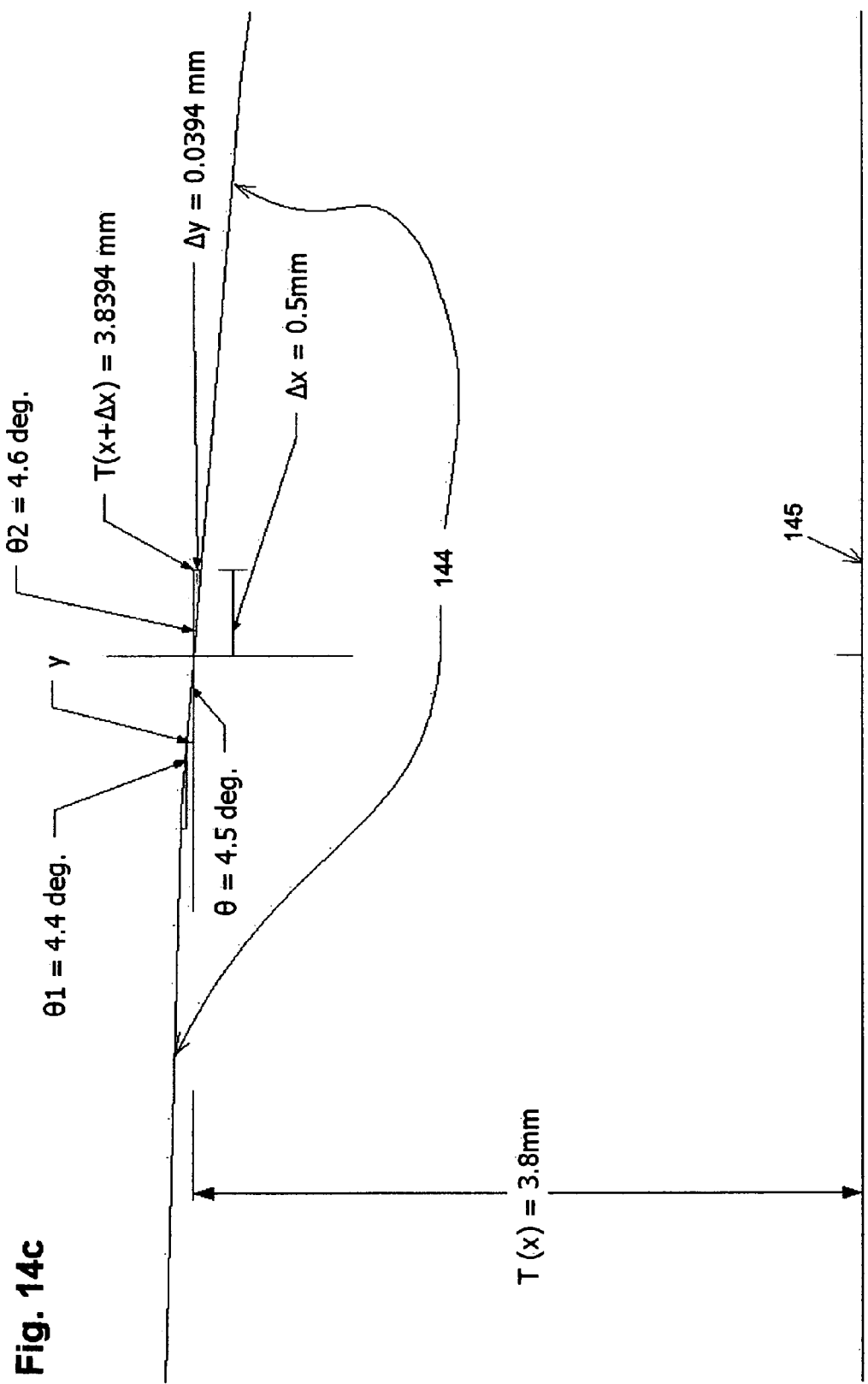

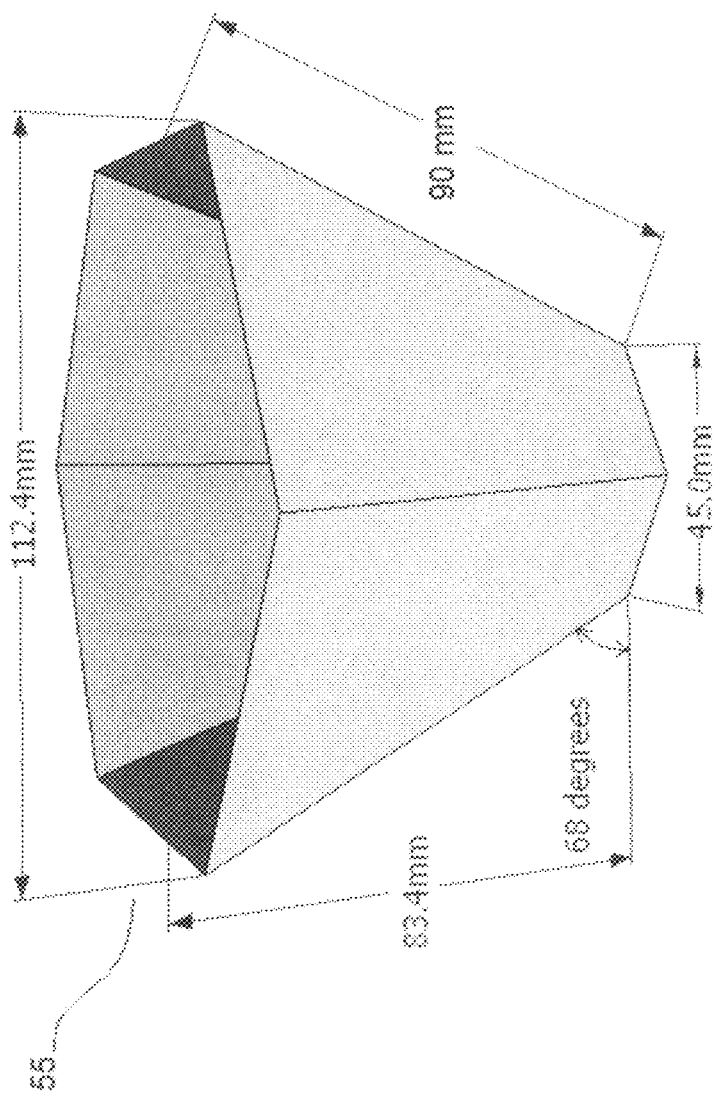

COMPACT LCPV SOLAR ELECTRIC GENERATOR

This is a Continuation-in-Part application of original application Ser. No. 12/702,561 Solar Power Generator filed on Feb. 9, 2010.

FIELD OF THE INVENTION

This invention relates to an innovative compact LCPV solar electric generator and more specifically to a conical optical configuration of mirror and lens with a planar circular PV solar panel, rotating simultaneously inside a clear protective environmental dome for substantial instantaneous increase in electrical power output.

BACKGROUND OF THE INVENTION

Photovoltaic concentrators are known in the industry as high concentration photovoltaic (HCPV), medium concentration photovoltaic (MCPV) and low concentration photovoltaic (LCPV). These concentrators operate mostly with a dual axis tracker to point the apparatus toward the sun. Photovoltaic cells comprising of semiconductor junctions as p-n junctions are used. It is well known that light with photon energy greater than the band gap of an absorbing semiconductor layer in a semiconductor junction is absorbed by the layer. Such absorption causes optical excitation and the release of free electrons and free holes in the semiconductor. Because of the potential difference that exists at a semiconductor junction (e.g., a p-n junction), these released holes and electrons move across the junction in opposite directions and thereby give rise to flow of an electric current that is capable of delivering power to an external circuit. As such photovoltaic cells offer a source of renewable energy, as once installed all they require is the sun to generate electricity. Unique potential of concentrated photovoltaic technology is made aware by the present LCPV invention.

LCPV systems are advantageous because they do not generate excessive heat at the photovoltaic cells; therefore they do not require active cooling by heat transfer fluid. Cooling of the solar panel with a passive heat sink is only needed.

It is apparent that current commercial developments such as driven by the National Solar Technology program under the US Department of Energy for PV cells and panels are focused to the cost reduction of the semiconductor photovoltaic cells and wafers together with their encapsulation, interconnection, etc.

Silicon PV cell wafer thickness is decreased from the standard 0.3 mm (300 μm) to reduce cell cost. However, it would be apparent that increasing the area of the PV cells whilst increasing the electrical power of the solar assembly does so with a cost that is approximately linear to the output, as this is essentially linear with area of the PV cells, silicon used, packaging materials, assembly, etc. Accordingly it would be beneficial to provide an increase in electrical power output for a given area of PV cell, and thereby lower costs both in the near-term and when large-volume production of PV cell technologies (such as crystalline silicon cells and multi-junction cells) is reached. The so-called concentrating photovoltaic, due to immediate and long-term benefits, has inspired substantial venture capital investment in CPV in recent years. The concentrator developments leverage work done for PV cells and concentrating thermal technologies for providing heating to buildings or generating electricity through turbines driven by heated liquid/gas systems. However, challenges for these CPV approaches include additional complexity, a much smaller market presence, and a very limited history of reliability/field-test data.

Recently the total installed CPV capacity is less than 1 MW in the United States and only a few MWs worldwide, virtually all using non concentrating silicon PV cells. Thus, the fundamental challenge of CPV is to lower cost, increase efficiency, and demonstrate reliability to overcome the barriers to entry into the market at a large scale. These challenges must all be addressed at the system level and include:

System-Level Design, where PV cell, optical train, and tracking must be engineered not only to work together but need to be designed for manufacturability, as well as cost, with attention given to tolerance chains, automation, scalability, and ease of assembly, maintenance;

Reliability, where factors specific to conventional prior art CPV systems include the high-flux, high-current, high-temperature operating environment encountered by the cells; weathering and other degradation of the optical elements, the mechanical stability of the optical train, and the operation of the mechanical parts of the tracking systems;

Cost, where PV cell cost is a substantial fraction of the total system cost but further reduction may be achieved with increased power output and reduced costs for the mechanical and thermal aspects of the solar power generator. Such approaches to lowering the cost of the system include system design for reducing required tracking accuracy, as well as refined an simpler mechanical engineering of the tracker, designing optical trains that are compatible with techniques for inexpensive, robust fabrication of what may in some designs be sophisticated optical surfaces, and provision of low cost thermal management solutions; and Efficiency, as improved efficiency is a direct way to lower the cost of the system and the area required to host a system for given power output; the area can have a significant effect on cost of electricity in most systems. As with cost and reliability, efficiency must be addressed at the system level to reduce parasitic losses so that systems can realize their potential efficiencies. Higher electrical output from a given area of solar flux input means higher efficiency.

Considering firstly the tracking system a variety of prior art techniques have been reported including polar, horizontal axle, vertical axle, two-axis altitude-azimuth, and multi-mirror reflective altitude-azimuth. For large planar PV solar panels of the prior art, single axis tracking increases annual output by approximately 30% whilst adding the second axis adds approximately a further 6%. As such only single axis tracking is typically employed with such solar panels. However CPV systems typically position the PV cells at or near the focal point of the optical train such that the increased complexity of two axis or altitude-azimuth tracking is required. Control of the tracking is generally dynamic, i.e. monitoring the solar signal within the optical train, passive by exploiting solar energy, or so-called chronological tracking wherein control is preprogrammed day-time variations.

The selection of control and tracking mechanism is also determined in dependence of the concentration. For example so-called low concentration systems, solar concentration of 2-100 suns, typically have high acceptance angles on the optical train thereby reducing the requirements for control/tracking. Such low concentration systems (LCPV) typically do not require active cooling despite the increased operating temperature of the PV cells which increases with effective number of sun concentration. Medium concentration systems (MCPV), 100-300 suns, require solar tracking and associated control plus more cooling and hence introduces complexity. High concentration systems (HCPV) employ concentrating optics consisting of dish reflector or Fresnel lenses that achieve intensities of 300 suns or more. As such HCPV systems require high capacity heat sinks and/or active temperature control to prevent thermal destruction and to manage temperature related performance issues.

THE PRIOR ART

An example of a CPV system is according to the prior art of T. Green in US Patent Application 2009/0,272,425 entitled "Concentrating Solar Energy Receiver" which uses a Stirling Engine to convert sun energy into electricity. The present invention differs from the optical configuration of Green. The present elements or segments of the lens are made of long curved surfaces rather than short straight flat surfaces. Furthermore the present lens invention consists of one element and one plastics material only for non-uniform illumination of the cells and there is no need to use multi-elements and multi-materials for light spectrum splitting required by the Green's lens design. The present conical mirror reflects light directly to the solar panel as opposed to the re-reflected light via a secondary reflector in Green's invention. Green's design is basically for uniform illumination. The present lens consists of 4 rings for non-uniform illumination of the PV solar panel and it casts 4 luminous rings separated with dark rings onto the surface of the PV solar panel.

L. M Fraas et al in U.S. Pat. No. 5,118,361 entitled "Terrestrial Concentrator Solar Cell Module" and L. M. Fraas in U.S. Pat. No. 7,388,146 entitled "Planar Solar Concentrator Power Module" disclose designs employing plastic Fresnel lenses in combination with a secondary concentrator element (metal light funnel) to couple to the multi-junction PV cells. In U.S. Pat. No. 7,388,146 Fraas teaches a system to remove tracking requirements for large PV panels to simplify their deployment. As such the concentration is low, whereas in U.S. Pat. No. 5,118,361 increased concentration is provided and requires that the solar cells be mounted with very good heat sinking due to the optical train having its focus at the small GaAs/GaSb cells. The heat sinking significantly complicating the design for large area solar cells as Fraas teaches in respect of small rectangular cells, wherein commercial GaAs fabrication is on 75 mm (3") or 100 mm (4") wafers. The present invention uses a mirror/lens assembly without a metal light funnel for direct solar energy concentration. In the present design configuration, there is no need for a second redirection of the reflected and refracted rays onto the PV solar panel.

J-G Rhee et al in US Patent Application 2007/0,113,883 entitled "Sunbeams Concentration Lenses, Process and Apparatus for Solar Photovoltaic Generator using Concept of Superposition" teaches a concentration lens that is comprised of multiple straight elements around a central element. Each element having grooves formed with increasing inclination as their distances from the central element increases. As a result the lens is intended to provide a uniform illumination at the surface of the PV cell. The present invention contains a 4 double convex ring lens for non-uniform illumination of the PV solar panel and it casts 4 luminous rings onto the surface of the PV solar panel. The region between any 2 adjacent luminous rings is a dark ring; therefore it is very different from Rhee's lens design. Rhee's lens is designed for uniform illumination on the PV cells only. The present lens invention takes advantage of non-uniform illumination for concentration onto a PV solar panel.

A similar approach is disclosed by Z. Schwartzman in US Patent Application 2008/0,041,441 entitled "Solar Concentrator Device for Photovoltaic Energy Generation" employing single piece prismatic optical elements which may be either reflective or transmissive in operation. Schwartzman further teaching the requirement for heat sinking for thermal management. O'Neill in U.S. Pat. No. 6,111,190 entitled "Inflatable Fresnel Lens Solar Concentrator for Space Power" taking the migration from glass to injection molded plastic for weight reduction a step further with a very thin molded sheet that is formed to the correct shape using gas pressure with the molded sheet as part of a balloon. The present unique invention uses a fabricated mirror and injection molded lens assembly combination inside a clear dome for direct solar energy concentration.

L. C Chen in U.S. Pat. No. 6,384,320 entitled "Solar Compound Concentrator of Electric Power Generation System for Residential Homes" and U.S. Pat. No. 6,717,045 entitled "Photovoltaic Array Module Design for Solar Electric Power Generation Systems" discloses a compound parabolic concentrator (CPC) with short straight flat elements acrylic concentrating Fresnel lens to provide an initial concentration of 5× to 10× (Fresnel lens) with a subsequent 20× to 50× by the parabolic mirror and final +1000× concentration by a third glass concentrating lens to multi-junction cells. Chen's whole lens is positioned parallel to the surface of the cell and there is no offset angle for the whole lens with respect to the PV cell. Chen employing a costly cermet coated stainless steel heat exchanger to implement a concentrated solar thermal (CST) system. L. C Chen in U.S. Pat. No. 6,653,551 entitled "Stationary Photovoltaic Array Module Design for Solar Electric Power Generation Systems" teaches a variant with dual Fresnel lenses forming part of the optical train with liquid based thermal management.

The present lens and conical mirror invention has different lens and mirror geometries, operating independently from each other. The present circular lens with double convex rings is made of long curved arcs and is tilted for operation. Short straight flat elements are not useful in the present invention for sun rays concentration. The present conical mirror is made with 12 flat mirror elements and it is not compound parabolic in shape. There is no need for a third glass concentrating lens placed on top of the PV cells. The refracted rays from the present lens and the reflected rays from the present mirror work independently from each other during concentration.

T. I. Chappell et al in U.S. Pat. No. 4,200,472 entitled "Solar Power System and High Efficiency Photovoltaic Cells used therein" discloses a solar power system including a tracking platform, a concentrator, and PV cell modules. The overall PV assembly includes a heat dissipation housing which supports a silicon cell across an open end of the housing and a heat transfer block physically engages the silicon PV cells and a metallic sponge and wick is attached to the heat transfer block, with the housing being partially filled with liquid to facilitate heat removal. The present invention does not require active cooling management for the solar panel.

Steven A. Johnson in U.S. Pat. No. 4,284,839 entitled "Internal Refractor Focusing Solar Energy Collector Apparatus and Method" discloses a large enclosed lens/mirror/receiver concentrator apparatus for equatorial mounting at an angle. Johnson uses a large lens with small straight serrations, the lens is larger than the mirror, a thin mirror and a fixed solar energy absorber. The apparatus requiring active temperature management with a heat transfer fluid.

In contrast the present invention configuration is compact and is mounted perpendicularly into the ground or perpendicularly to a roof. This configuration uses a lens with long curved elements, a 23 inch tall twelve sided conical mirror and a round 16 inch diameter PV solar panel. The present lens is smaller than the mirror and the lens is installed within the larger diameter of the conical mirror in opposition to Johnson's design. No active temperature management is required on the PV solar panel. In Johnson's design all radiation must go through the rectangular lens first before reaching the rectangular solar panels. In the present invention design, one portion of the radiation only goes through the circular lens and the remaining portion of the radiation is reflected directly from the conical mirror before arriving at the solar panel. The diameter of the lens of the present invention is about 23" while the diameter of the conical mirror at the wider end is about 35". There is about a 6" air gap clearance on each side between the lens and the mirror where radiation is reflected directly to the solar panel without going through the lens.

The lens and mirror of Johnson's design work together for concentration of sun rays. In contrast the lens and the mirror of the present invention work independently from each other for concentration of sun rays. In Johnson's design, the electrical energy produced is only from a portion of the solar flux from photovoltaics and the amount produced is not stated; however the present invention relies on all the solar flux to produce directly at least two times more electrical energy than comparable conventional technology daily.

Hanehira et al. in U.S. Pat. No. 6,605,774 B2 entitled "Photovoltaic Device and a Method of Manufacturing Thereof" discloses a small round photovoltaic device less than 2 inches in diameter that does not crack and less likely to become disconnected.

The concept of the present invention is to use a 16 inch diameter flat round solar panel composed of 24 PV cells of fan geometries for concentration of the solar flux and increase short circuit electrical current by at least 4 times. The tab wires connecting adjacent cells go through holes with generous clearance between adjacent PV cells to account for heat expansion/contraction during operation and prevent cracking.

Hanehira's solar panel is very small compared to the present invention and its design is not for scaling from about 1.5" diameter to 16" diameter. Hanehira's cells are made of amorphous silicon and coated with acrylic, PET and EVA (ethyl vinyl acetate). The PV cells of the present invention are made of mono or poly crystalline silicon. The PV cells of the present invention could also be multijunction cells. All acrylic and EVA will melt if applied to the PV cells of the present invention due to the high current magnification. The present invention can not take Hanehira's design and apply it to the present design because the present invention will not be able to concentrate the sun rays for an increase of 4 times the electrical current. It will not work even with a group of Hanehira's small panels forming a large 16" diameter flat round solar panel. The specific round lens design of the present invention must work with the specific round solar panel design of the present invention in the specific apparatus structure of the present invention for non uniform multi-ring illumination. The area of multi ring illumination on the solar panel of the present invention is different each day.

As such the majority of the prior art in CPV/CST systems have addressed either concentrator designs, for example to increase effective number of suns or reduce requirements for tracking systems, or thermal management systems. Such systems within the prior art being targeted primarily to large flat PV panel geometries with low concentration factor concentrators to improve performance without increased cost and complexity from tracking systems, or high concentration systems with special multi-junction small PV cells capable of operating at elevated temperatures or CST systems that generate electricity as a secondary step after the initial heating of a gas or liquid at the concentration point of the CST optical assembly.

It would be an advancement of the Prior Art if LCPV systems can prove to generate substantial amount of electrical power, more than outputs achievable from conventional fixed flat crystalline silicon panels occupying the same projected planar surface area. The amount of silicon used in the present invention is reduced by at least two times. The planar surface area occupied by the present apparatus is also reduced by two times.

As such it would be beneficial for LCPV systems in consumer, residential, commercial, and industrial environments to exploit solar concentrators to at least double the electrical output per unit area of deployed solar panel. It would be further beneficial for such PV systems to employ low cost tracking systems to further enhance overall electrical output and be absent of complex or expensive active thermal management aspects which increase cost and reduce reliability.

SUMMARY AND OBJECTS OF THE INVENTION

An unique and compact LCPV concentrator totally enclosed in a clear semi-spherical protective environmental dome. It concentrates 5 to 20 times sun. The optical assembly consists of a particular lens with long double convex ring elements, a 12 sided conical mirror and a planar circular PV solar panel. The increase of electrical current by the mirror is 3 times and by the lens is one time. The increase of electrical power production daily is at least two times more, compared to fixed flat crystalline silicon panels that occupy the same planar surface area. Factors like optical train misalignment, tracker accuracy and effects of weather have been taken into account for electrical power production.

This sizeable increase of power claimed from a compact LCPV device was thought not possible by the prior LCPV art.

In accordance with an embodiment of the invention there is provided an apparatus comprised of:

a sixteen inch diameter flat round PV solar panel responsive to radiation within a predetermined first wavelength range and characterized by at least first and second dimensions along axes perpendicular to one another in a plane parallel to the surface of the solar panel facing the sun.

a twenty three inch tall, twelve sided conical mirror comprising an inner reflective surface and an outer non-reflective surface and having a first end disposed towards the solar panel and a distal end disposed towards a lens, the first end having a geometry determined in dependence upon the geometry of the solar panel and the inner surface being reflective to radiation within the predetermined first wavelength range, wherein in operation the twelve flat panels of the reflector are outwardly offset at a predetermined angle between 15 and 30 degrees with respect to an axis between the center of the lens and the center of the solar panel.

a circular twenty three inch diameter lens transmissive to a predetermined second wavelength range that refracts rays within the predetermined first wavelength range area reflected by the conical mirror onto the solar panel, the circular lens characterized by at least third and fourth dimensions along the same axes as the first and second dimensions respectively wherein the third dimension and fourth dimension are larger than the corresponding first dimension and second dimension by 40%, wherein in operation the lens has a predetermined separation from the surface of the solar panel facing the sun and the plane of the lens is further transversely offset by a predetermined angle between 1 and 25 degrees with respect to the plane of the solar panel facing the sun.

a thirty nine inch diameter clear semi-spherical protective environmental dome enclosing the top components of the apparatus for harsh environmental protection.

a base to support the modular apparatus.

a post to support the base for mounting the apparatus perpendicularly onto a roof or for perpendicular insertion into the ground.

a conical frame for fix mounting the mirror, lens and solar panel.

a turntable mounted at the bottom of the fixed base to provide for the daily azimuth and altitude rotations of the conical frame.

two brackets mounted on the turntable for pivoting the conical frame for the daily altitude elevation oscillations.

a biaxial sun position sensor, a biaxial tracker, a biaxial controller and two miniature DC motors with gears to provide short intermittent movements and follow the daily path of the sun.

and a round exhaust fan mounted at the center bottom of the base for removal of hot humid air that may produce water condensation inside the clear dome in cooler days.

It is an object of the present invention to use a bi-axial tracker to provide short intermittent movements of a fraction of one second each that follow the path of the sun daily. The sum of the intermittent altitude movement vector with the intermittent azimuth movement vector provides a resultant vector that follows the different daily paths of the sun. The path of the sun is the diagonal resultant of the vectorial sum of the mutually perpendicular azimuth vector and the altitude vector at intermittent intervals.

It is an object of this invention to provide independent oscillating rotation of the optical assembly composed of the lens, mirror together with the PV solar panel in a conical aluminum cage mounted and pivoted on a turntable.

Another object of this invention is to allow operation of the compact solar generator in harsh environmental conditions with a clear semi-spherical dome protector.

Another object of this invention is to provide a low cost product for conversion of solar energy into electricity that is user friendly with low maintenance. The tracker operates automatically, unattended making it user friendly. The clear environmental protective dome does not require maintenance for user friendly operation. The present LCPV invention is used in consume r, residential, commercial, and industrial environments to exploit solar concentrators to at least double the electrical output per unit area of deployed solar panel.

Accordingly it is an object of the invention to provide LCPV systems employing optical concentrators and tracking systems without the requirement for active thermal management.

Other aspects and features of the present invention will become apparent to those ordinarily skilled in the art upon review of the following description of specific embodiments of the invention in conjunction with the accompanying figures.

Embodiments of the present invention will now be described, by way of example only, with reference to the Figures listed below.

BRIEF DESCRIPTION OF THE DRAWINGS

FIG. 10a shows the top and bottom views of each of the 24 PV cells used to construct solar panel 7. Tab wires are shown soldered to each PV cell on the top view.

FIG. 13a shows one half cross section of lens 6 detailing the shape of each of the four long double convex ring segments.

FIG. 14 defines one half of the arc width on top or bottom of each concentrating ring transverse cross section with a general curve lens equation, curve 141.

FIG. 14c shows curve 144 and the height of the top or bottom convex arc at any point of each concentrating ring transverse cross section by finite element analysis.

FIG. 16b shows a front isometric view of conical mirror 55 with dimensions.

DETAILED DESCRIPTION

The present product invention provides a low cost compact LCPV solar electric generator according to attached FIGS. 1 to 16e. An optical assembly composed of a conical mirror and a circular lens is mounted above a flat round PV solar panel inside a conical frame. The whole conical frame assembly rotates with short intermittent movements bi-axially to follow the path of the sun daily. The rotations to follow the sun are reset automatically every twenty four hours. The entire apparatus is environmentally protected against harsh weather with a clear dome mounted on a base. The solar generator works without active thermal management or cooling of the PV solar panel. The present particular configuration of the apparatus is non-obvious compared to configurations of other apparatus from the previous art.

Reference may be made below to specific elements, numbered in accordance with the attached figures. The discussion below should be taken to be exemplary in nature, and not as limiting of the scope of the present invention. The scope of the present invention is defined in the claims, and should not be considered as limited by the implementation details described below, which as one skilled in the art will appreciate, can be modified by replacing elements with equivalent functional elements.

Figure 1:
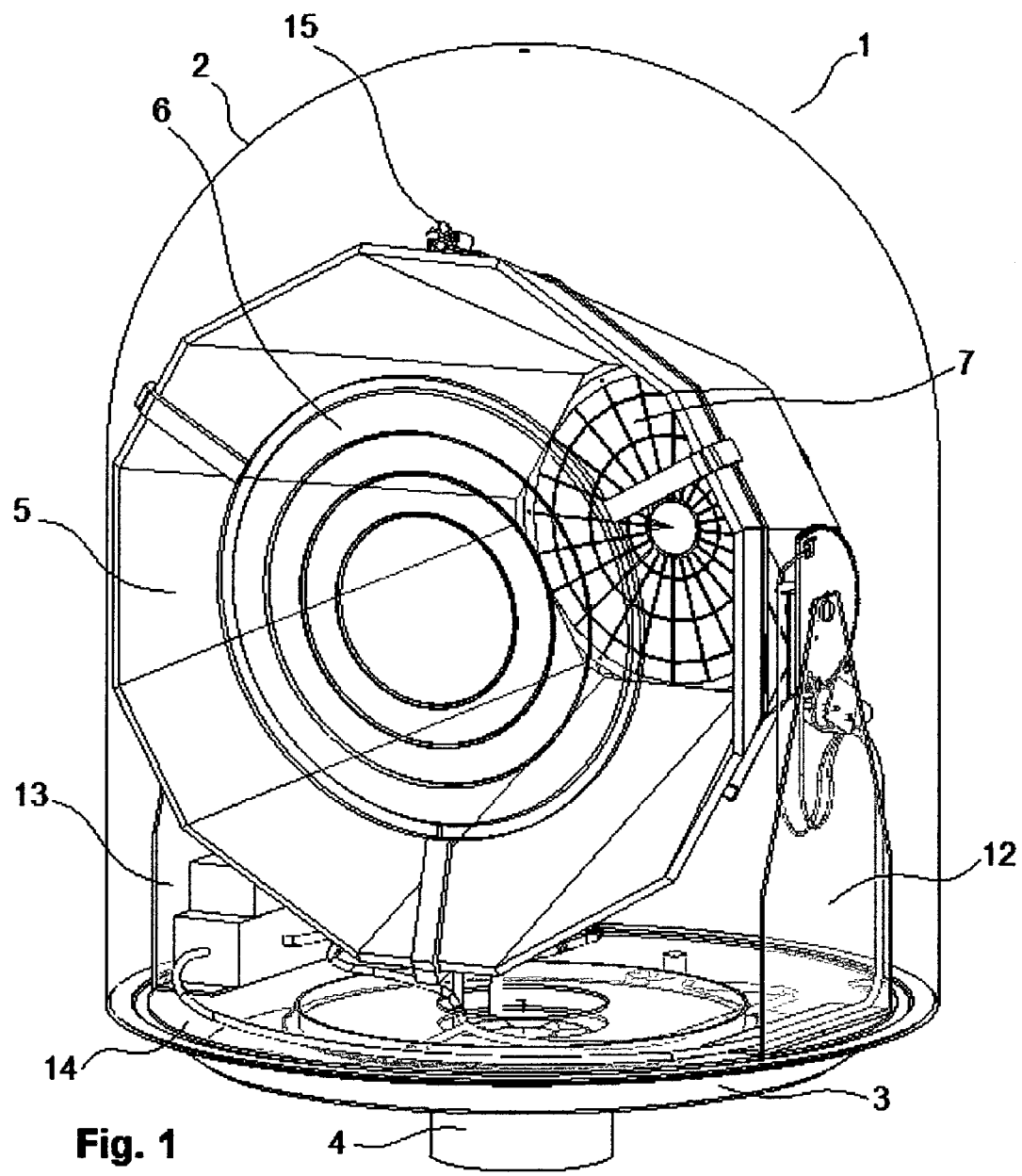
FIG. 1 depicts a front left isometric view of a compact LCPV solar electric generator 1 with conical mirror 5, circular lens 6, flat round PV solar panel 7 and clear dome 2.
Figure 5:
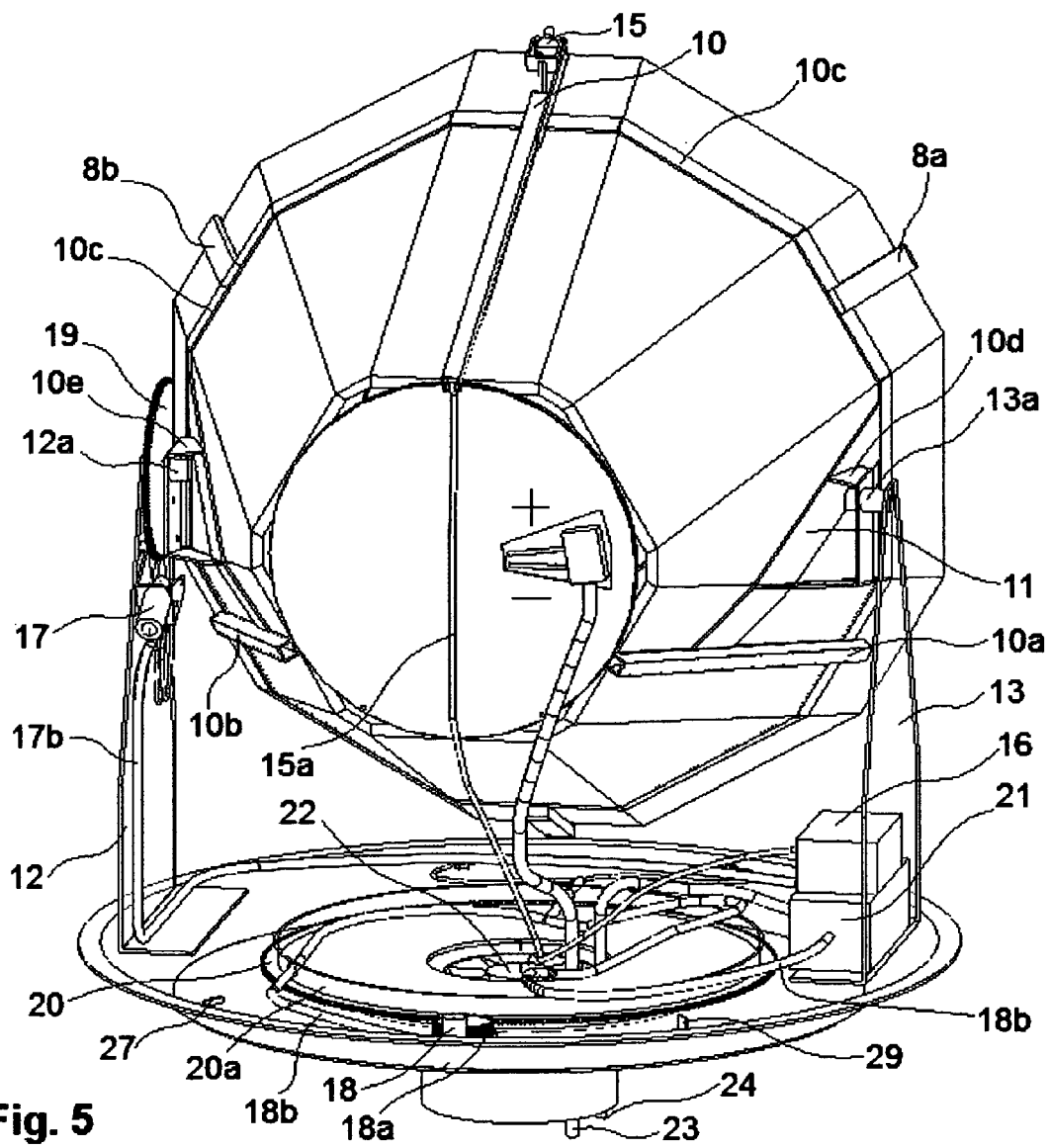
FIG. 5 depicts a rear view of FIG. 1 with clear dome 2 and turntable platform 14 removed for a clearer illustration.

Illustrated in isometric front left view FIG. 1 is a compact LCPV solar electric generator 1 according to an embodiment of the invention. As shown solar generator 1 comprises of:

a transparent or clear semi-spherical dome 2 thermoformed of PETG (polyethylene terephthalate glycol), CAB (cellulose acetate butyrate), SAN (styrene acrylonitrile resin), co-polyester, vinyl, acrylic or polycarbonate sheet for maximum transmission of solar flux toward solar panel 7 at low cost. For example if the PV cells are Silicon then dome 2 would be transparent to at least significant portions of the visible spectrum as Silicon solar cells are responsive from approximately 400 nm to 700 nm. If the PV cells are GaAs transparency would be 450 nm to 900 nm, and for $CuInSe_2$/CdSe (CIS) transparency would be 500 nm into the near infra-red at 1250 nm. The semi spherical dome 2 has a diameter of 39 inches. The clear aerodynamic shape dome is for environmental protection against hailing, icicles, snow, rain, very strong winds, lightning and sand storm to make the apparatus useful anywhere on earth.

a round dish type base 3 made of ABS (acrylonitrile butadyene styrene) structural foam, PVC (polyvinyl chloride) plastics or aluminum.

a post 4 made of structural foam plastics or aluminum.

a twelve sided conical mirror 5 made of PETG (polyethylene terephthalate glycol) aluminum coated mirror sheets mounted on three quarter inch thick polyisocyanurate foam insulation boards.

a circular lens 6 injection molded with transparent or clear PETG (polyethylene terephthalate glycol), SAN (styrene acrylonitrile resin), CAB (cellulose acetate butyrate), co-polyester, vinyl, acrylic or polycarbonate polymer.

a PV solar panel 7 made with twenty four mono crystalline silicon cells or multi-junction cells.

a ball bearing type aluminum turn table with its top circular platform 14 made of aluminum.

brackets 12 and 13 rising from platform 14 to support and pivot a conical frame assembly 11 shown in FIG. 5 housing mirror 5, lens 6 and solar panel 7.

a bi-axial sun position sensor 15 to ensure that the conical optical assembly with PV panel 7 will simultaneously point toward the sun.

Conical mirror 5 and lens 6 direct concentrated solar radiation to PV panel 7 for instant electricity generation. Apparatus 1 occupies 1,195 inches square of planar surface area.

Figure 2:
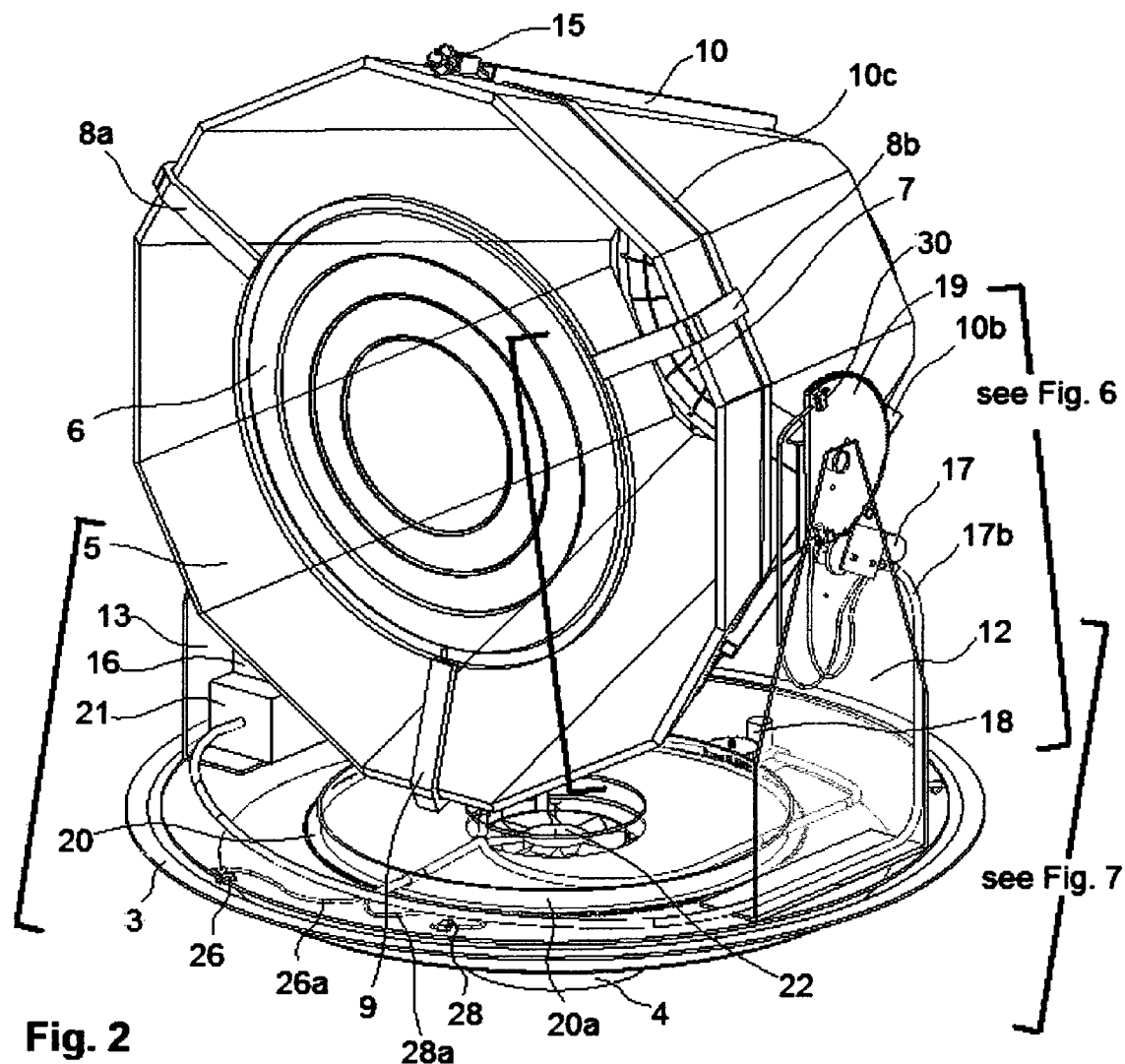
FIG. 2 depicts a left view on the solar generator of FIG. 1 with clear dome 2 and turntable platform 14 removed for a clearer illustration of otherwise hidden components.

Isometric front left view FIG. 2 shows apparatus 1 with dome 2 and platform 14 removed to clearly expose components that are not easily discernible. Conical mirror 5 is installed inside a conical frame assembly composed of members 10, 10b and 10c as shown in FIG. 2 and members 10a and 10c as shown in FIG. 4. Circular lens 6 is mounted near the large diameter end of conical mirror 5 with supports 8a, 8b and 9 connected to strap ring member 10 c of the conical frame as shown in FIG. 2. Preferably supports 8a, 8b and 9 are injection molded clear together with lens 6 to form one integral piece for simplicity of installation and lower manufacturing cost. PV panel 7 is mounted at the smaller diameter end of the conical frame forming the base for a strong conical frame structure. Bi-axial sun sensor 15 is mounted on member 10 behind and below the large diameter end of conical mirror 5 near the top. The conical frame pivots for the altitude (zenith) rotations between bracket 12 and 13 that rise from platform 14 (shown in FIG. 1). Aluminum gear 19 and DC motor 17 provide the short intermittent altitude rotations daily. Round dish base 3 houses a turntable for the short intermittent azimuth rotations daily. The top half of the turntable rotates and is composed of aluminum gear 20, support ring 20a and aluminum platform 14 shown in FIG. 3. The bottom half of the turntable is fixed and centrally located at the center of base 3. Ball bearings are used between the top and bottom halves of the turntable to reduce friction during rotation. DC motor 18 is engaged to gear 20 to provide short intermittent azimuth (horizontal) movements or strokes of the turntable. Box 16 contains the bi-axial tracker electronics. Box 21 contains the electronics for DC motors control which houses a pair of twenty four hour digital programmable logic controllers, one for altitude rotation and the other for azimuth rotation. Short irregular bi-axial intermittent rotational movements are determined by sensor 15, the bi-axial tracker and the twenty four hour digital programmable logic controllers working together. A more detailed explanation of the irregular incremental movements is provided further down this text. Exhaust fan 22 is mounted inside the fixed half of the turntable to remove warm humid air and avoid water condensation inside the apparatus during cooler days.

Figure 3:
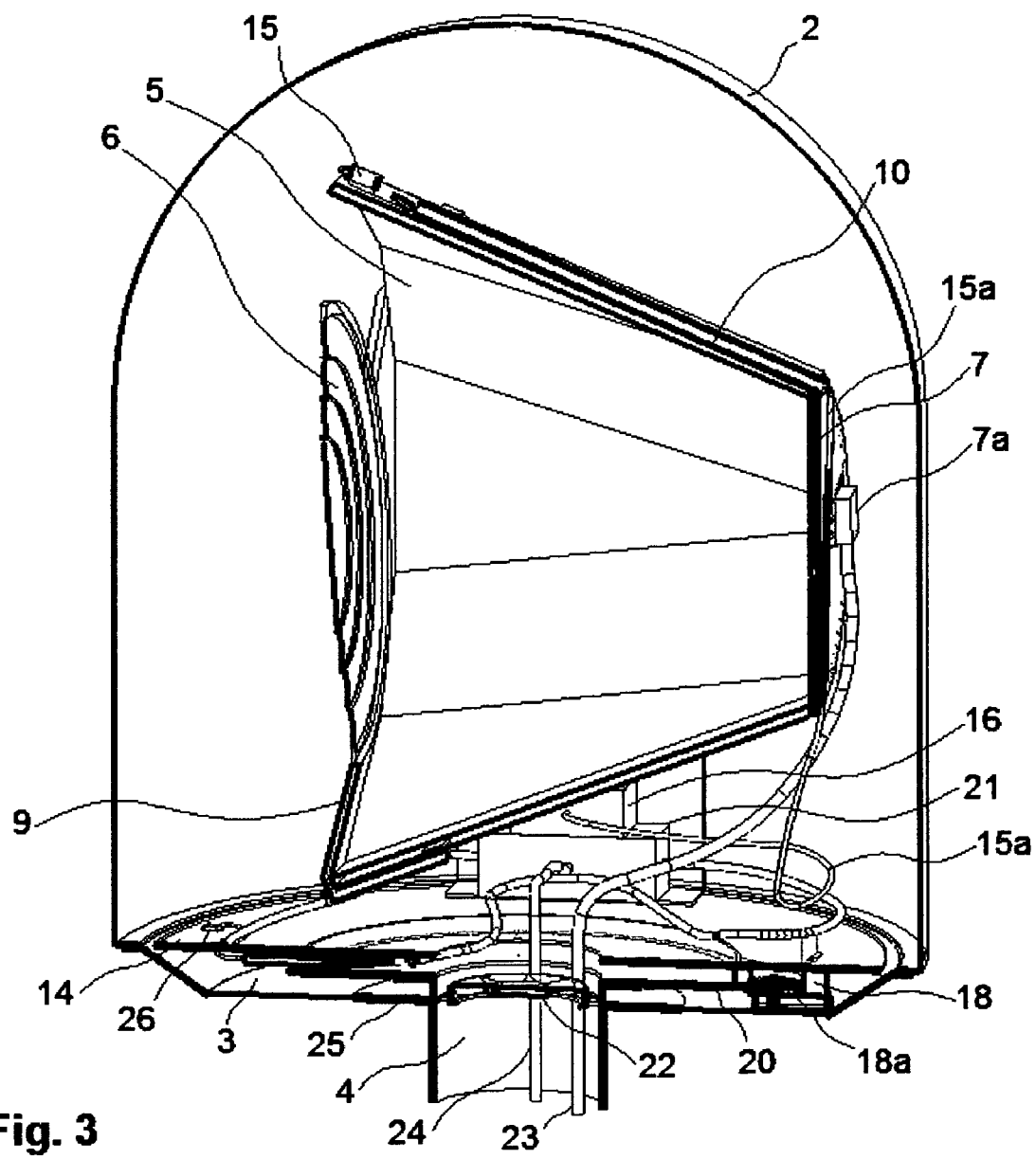
FIG. 3 depicts a cross section view of the right half of solar generator 1 of FIG. 1.
Figure 4:
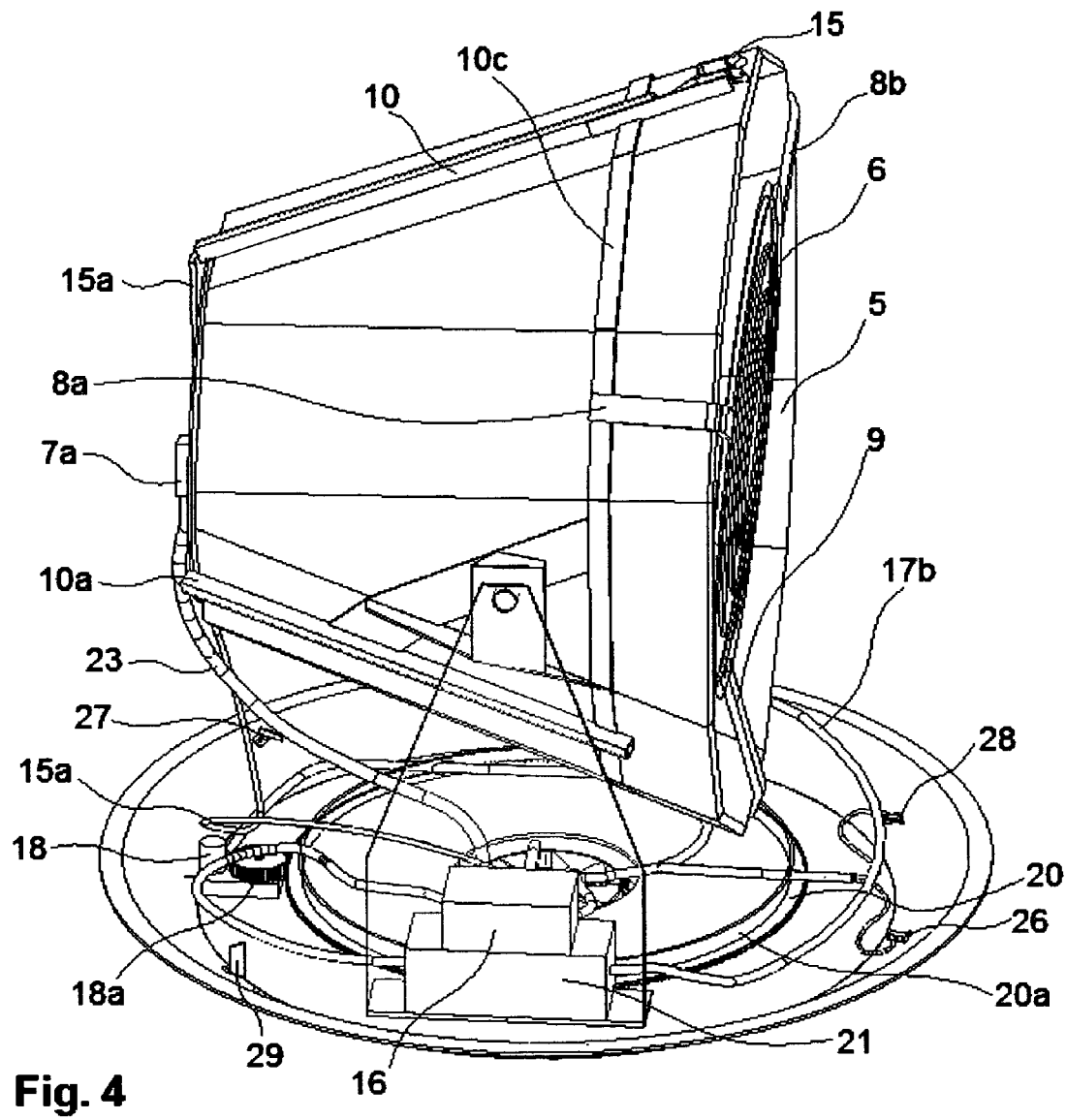
FIG. 4 depicts a right view of FIG. 1 with clear dome 2 and turntable platform 14 removed for a clearer illustration.
Figure 7:
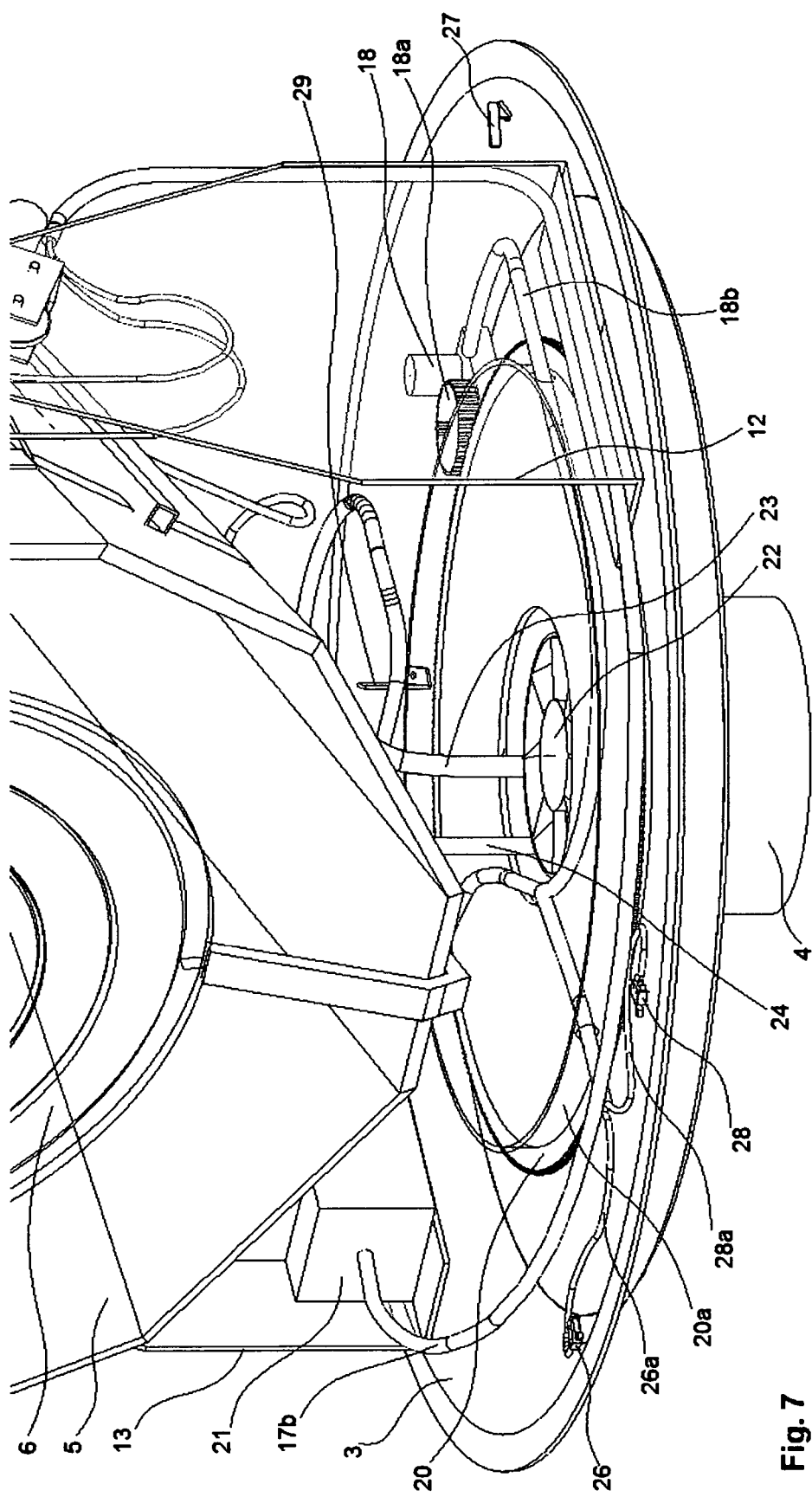
FIG. 7 depicts an enlarged view of the respective area within brackets in FIG. 2 showing the azimuth mechanism for horizontal rotation of the apparatus with platform 14 removed.

FIG. 3 shows the right side of one half cross section of apparatus 1. Lens 6 is shown with a 4 degree tilt with respect to solar panel 7. Cable 15a connects sun sensor 15 to the bi-axial sun tracker electronics housed in box 16. The positive and negative output terminals of solar panel 7 are located in box 7a. Flat round platform 14 is part of the top side of the turntable and is used to support the entire conical frame structure. Cable 23 is connected to both output terminals of solar panel 7 for power delivery to the energy consumption load through post 4. Cable 23 goes through platform 14 and through one of the slots created between the outer diameter of fan 22 and the fixed bottom half plate 25 of the ball bearing turntable as shown in FIG. 7. Cable 24 goes through platform 14 and provides DC power to controller box 21 from a storage battery at the energy consumption location which was charged by apparatus 1. Spur gear 18a engages motor 18 to gear 20 for irregular intermittent horizontal rotation of the top half of the turntable.

The components required for control of the azimuth rotations are shown in isometric right view FIG. 4. Sun sensor detector 15, sun tracker control box 16, twenty four hour digital programmable logic control box 21, motor 18, gear 18a and gear 20 are used to provide azimuth rotational movements. Limit switch 26 is mounted on the outer underside of platform 14 (shown in FIGS. 1 and 3) and is controlled to move toward stop limit bracket 27 fastened stationary to base 3. The stop limit bracket 27 is located 140 degrees left of the north-south direction along the center vertical axis of apparatus 1 when viewed from the rear, so that the apparatus points toward the sun at sun rise during long summer days in the northern hemisphere after limit switch 26 is activated by stop limit bracket 27. The azimuth twenty four hour digital programmable logic controller will rotate gear 20 from stop limit bracket 27 before sunrise to timely point conical frame 11 toward the sun at sunrise during short winter days for locations in the northern hemisphere. Both the azimuth twenty four hour digital programmable logic controller and sun tracker controller will continue to rotate conical frame 11 after sunrise toward the west when the sun appears in the winter. During days or anytime during the day that the sun does not appear then azimuth twenty four hour digital programmable logic controller will continue to rotate conical frame 11 toward the west. Limit switch 28 is mounted on the inner underside of platform 14 (shown in FIGS. 1 and 3) and is controlled to move toward stop bracket 29 fastened stationary to base 3. The stop limit bracket 29 is located 140 degrees right of the north-south direction along the center vertical axis of apparatus 1 when viewed from the rear, so that the apparatus points toward the sun during sunset in the long summer days in the northern hemisphere. Daily, the azimuth rotation is from left limit bracket 27 to right limit bracket 29 by 280 degrees controlled by the azimuth twenty four hour digital programmable logic control in box 21 and sun tracker box 16. Beyond sunset the azimuth programmable logic controller will return conical frame 11 to stop limit bracket 27 position in a continuous motion after limit switch 28 is activated by stop limit bracket 29, ready for the next day operation cycle.

Likewise, similar reverse operation applies for locations in the southern hemisphere.

The electronic circuitry inside tracker box 16 and control box 21 are interconnected between the two boxes to provide the required control for bi-axial rotations.

Essentially two control modes of operation are used for days with sun and without sun. The first control mode is for a visible sun and it uses sun tracker control together with twenty four hour programmable logic control generating short irregular intermittent movements. The second control mode is for a non-visible sun and it uses twenty four hour programmable logic control only, generating predetermined short regular intermittent movements to cover the apparent path of the sun during the day. When the sun is not visible, the first mode will switch to the second mode automatically and cause conical frame 11 to move toward the west from sunrise to sunset in short regular incremental motions. The twenty four hour programmable logic control circuit is designed to reset operation to the first mode when the sun appears again. Both modes work independently from each other and will switch to the other mode automatically according to the sun visibility. The first mode used when the sun is present and the second mode used when the sun is not present.

The vectorial sum of the small incremental horizontal and vertical movements defines the path of the sun at any time when there is sun.

FIG. 5 is an isometric rear view of apparatus 1 with dome 2 and platform 14 removed to expose the conical frame structure with more details; otherwise hidden components are not clearly visible. It shows pivoting brackets 10d and 10e as integral parts of aluminum conical frame 11. Members 10, 10a, 10b and 10c, brackets 10d and 10e form a welded aluminum conical frame structure 11. PV solar panel 7 is fastened to members 10, 10a and 10b and used to form the bottom of conical frame 11. Cylindrical pivots 12a and 13a are fastened across risers 12 and 13 respectively. Conical frame 11 is pivoted for the elevation rotations between pivots 12a and 13a to adjust for the inclination of the sun during diurnal motions.

Cable 15a from sensor 15 goes through member 10 which is a square hollow aluminum tube used for guiding the sensor wires into tracker box 16. Altitude gear 19 is mechanically attached to bracket 10e and pivots together with conical frame 11. Altitude motor 17 is engaged to gear 19 and provides the short intermittent elevation motions. Cable 17b carries wires of motor 17 and wires of the two altitude limit switches for the altitude movement control into control box 21. Azimuth motor 18 and gear 18a are mounted stationary inside base 3 at a central location as shown in FIG. 3 to reduce the length of cable 18b into control box 21. Gear 18a engages motor 18 to azimuth gear 20. Cable 18b carries wires of motor 18 and wires of the two azimuth limit switches for the azimuth movement control into control box 21.

The independent irregular intermittent horizontal and vertical short movements are created by the interaction of the sun position detected by bi-axial sensor 15, the two tracker electronics circuitries in box 16 and the two separate twenty four hour digital programmable logic controllers in control box 21. The irregular intermittent movements are created by the "on" time set between 0.1 and 0.9 second interval and the "off" time set between one and two minutes interval by the twenty four hour programmable logic controllers. An irregular intermittent movement occurs when a movement signal from tracker control turns on and coincides with the "on" time set by the respective twenty four hour digital programmable logic controller. In the first control mode, only the "on" time movement signal of tracker control that coincides with the on time movement signal of the twenty four hour programmable logic control will create an irregular intermittent horizontal or vertical movement. At certain times, both horizontal and vertical movements can happen simultaneously. At other times, both movements can occur independently from each other. The motions created by the first control mode will change automatically to the second control mode once sun is not present and vice-versa. The optical assembly and the PV panel are aligned by conical frame 11 to point toward the sun; however a high precision tracking movement is not required because any misalignment between apparatus 1 and the sun resulting from operation is compensated by the wide angle of incident rays acceptance inherent to apparatus 1. It is not necessary to point apparatus 1 to the sun with high precision. A few degrees out does not impair substantial electrical current generation. Accordingly a low cost tracker can be employed allowing manufacturing costs to be reduced.

The drain on generated electrical power from the driving elements of each of the altitude and azimuth rotators is insignificant because very small DC motors (with rated torque each motor of less than 2 Newton centimeter and less than 100 milliamps) are used that consume less power, their relative sizes compared to the size of the apparatus are shown in FIG. 5. The electrical drain for these motors, trackers and controllers is small compared to the power generated as lightweight plastic lens, plastic mirror and aluminum frame structure allow small drive motors to be used and thereby not consume much power.

The choice of low cost standard common materials for crystalline silicon PV cells, plastics mirror, plastics lenses, aluminum conical frame, electronics tracker, clear plastics dome and compact size of the apparatus results in a reduced cost solar electric generator. A common solar power generator can be implemented in some embodiments of the invention to leverage high volume manufacturing cost reductions.

It would be apparent to one skilled in the art that solar power generators according to embodiments of the invention provide for reduced installation costs as the generators are designed for post mounting and hence may be deployed without requiring physical infra-structures be present. Where the generators are not post mounted but are attached to physical infra-structure the reduced physical footprint of the generators according to embodiments of the invention allow increased flexibility in their placement.

It would also be evident that fewer models may be commercially produced in "large scale" to leverage high volume manufacturing cost reductions, designed with small incremental biaxial movements for a broad range of populated latitudes and longitudes of the earth rather than requiring too many different units to cover all potential latitudes.

It would also be apparent to one skilled in the art that the solar power generators according to embodiments of the invention presented supra are intended to provide solar electric power at high level at a minimum of four times increases of electrical current on a continuous basis as long as there is sun. They distinguish from existing typical solar panel deployments on the basis that they are compact, affordable, lower cost and inexpensive. There is no requirement of active cooling of the silicon cells, they operate essentially with less maintenance. By virtue of the specific combined concentrator lens, conical mirror and round PV solar panel, the assembly is tolerant to misalignments and reduced tracking accuracy in positioning of its initial deployment. According to embodiments of the invention these low cost, compact generators rather than producing only approximately 400-watts average per day in a deployment such as Toronto, Canada (for a 60 watt fixed PV panel module) that they would produce more than 800 watts power daily under the same conditions. Factors like optical train misalignment, tracker accuracy, variation in loads and effects of environment have been taken into account for electrical power production.

Such modules would be marketed using watts-hour average rather than misleading maximum watts output. Accordingly it is anticipated that twelve typical units may be capable of delivering about 800 watts-hr each unit to easily supply a 10,000 watts-hr system capacity to a user daily.

Figure 6:
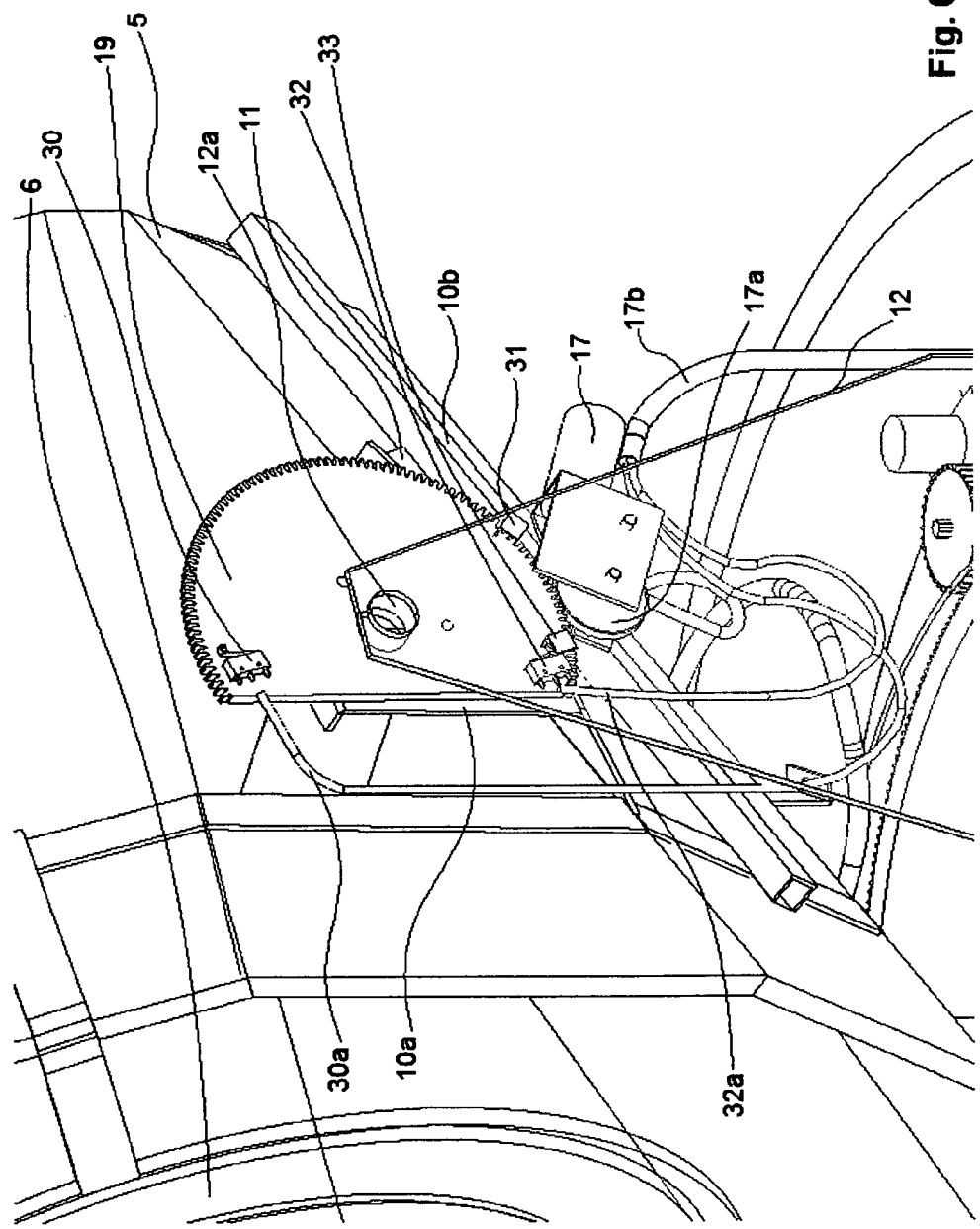
FIG. 6 depicts an enlarged view of the respective area within brackets in FIG. 2 showing the altitude mechanism for elevation rotation of apparatus 1.

An exploded left view (within the respective brackets in FIG. 2) of the altitude mechanism is shown in FIG. 6, there is depicted a section of the left side of apparatus 1. Conical frame 11 is pivot mounted to two support brackets 12 and 13 which are attached to base plate 14. Conical frame 11 is oscillated between pivot 12a and pivot 13a (shown in FIG. 5). Cylindrical pivot 12a is shown fastened to the top of riser 12, Gear 19 is fastened stationary to bracket 10e and allows altitude rotation of conical frame 11. Gear 17a engages motor 17 to rotate gear 19 for the altitude movements. The assembly of gear 17a and motor 17 is installed and fastened stationary to riser 12 as shown. Altitude limit switches 30 and 32 are installed on one side of gear 19 as shown. Stop limit brackets 31 and 33 are mounted on support riser 12 as shown.

The components that contribute to the altitude rotation movements shown in FIG. 6 comprise of motor 17, gear 17a, gear 19, bracket 10e, conical frame 11, pivot 12a and riser 12. The flat edge of D shape gear 19 is aligned perpendicular to base 3 (shown in FIG. 3) when conical frame 11 points toward the horizon. Limit switch 32 is mounted thirty degrees bottom left of the rotating axis of pivot 12a on gear 19 when viewed from the left as shown and is controlled to move counter clockwise toward stop limit bracket 33 fastened stationary to riser 12. The stop limit bracket 33 is located on riser 12 such that when limit switch 32 is activated, the conical frame 11 points toward the horizon where the sun rises or sets. Limit switch 30 is mounted thirty degrees top left of the rotating axis of pivot 12a on gear 19 when viewed from the left as shown and is controlled to move clockwise toward stop limit bracket 31 fastened stationary to riser 12. Conical frame 11 will rotate in a south to north direction from horizon to zenith (a total of 130 degrees rotation between limit brackets 33 and 31) between sunrise and noon hour during long summer days in the northern hemisphere. Sun sensor 15 (shown in FIG. 1), the altitude electronic circuitry in tracker box 16 (shown in FIG. 3) and the altitude twenty four hour digital programmable logic control in box 21 (shown in FIG. 3) will cause gear 19 to rotate from stop limit bracket 33 at sunrise to timely point conical frame 11 in a north direction toward the sun at noon hour to compensate for a shorter time sun path during short winter days for locations in the northern hemisphere. There is no need for activation of limit switch 30 by stop limit bracket 31 after the noon hour in the spring, fall and winter days because when the sun starts to go down, the altitude sun tracker electronics reverses the movements and will cause conical frame 11 to move down in short irregular increments toward the horizon in the first tracker control mode. Similar set up applies to locations in the southern hemisphere.

From noon hour to sunset conical frame 11 is designed to rotate in a north to south direction daily controlled by the altitude sun sensor, altitude tracker and altitude twenty four hour digital programmable logic controller.

Beyond sunset the altitude twenty four hour programmable logic controller will park the conical frame 11 so that it is pointed toward the horizon activating limit switch 32, ready for the next day operation cycle.

The altitude sun tracker control circuitry and the altitude twenty four hour programmable logic control circuitry are built into the first and second control modes. For days when the sun is not visible, the first mode will switch to the second mode automatically and cause conical frame 11 to move up from sunrise to noon hour and down from noon hour to sunset to follow a predetermined average sun path between end of summer and end of spring. By having conical Frame 11 to follow a predetermined average path of the sun between end of summer and end of spring it will minimize the loss of concentrated power due to misalignment of frame 11 to the sun, since the optical assembly is designed to have a wide optical angle of acceptance of solar flux.

The altitude twenty four hour programmable logic control circuit is designed to follow this predetermined average path of the sun and the sun sensor 15 will reset operation back to the first mode when the sun appears again. Therefore in any day when the sun appears again, the second control mode will enable automatically the first control mode. Both first and second control modes can work independently from each other.

An exploded isometric front left view (within the respective brackets in FIG. 2) of the azimuth mechanism is shown in FIG. 7, platform 14 is removed otherwise some hidden components are not clearly illustrated. There is depicted part of the turntable on base 3 with a ball bearing mount to allow low friction rotation of conical frame structure 11.

Gear 20 is fastened to support ring 20a which is also attached to platform 14 forming the top rotating half of the turntable. Riser brackets 12 and 13 are erected on platform 14 to support conical frame structure 11. Gear 18a engages motor 18 to rotate gear 20 for the azimuth movements. The assembly of gear 18a and motor 18 is installed and fastened stationary to base 3 as shown. Azimuth limit switches 26 and 28 are installed under platform 14 at shown locations. Stop limit brackets 27 and 29 are mounted on base 3 at shown locations to provide a limit of 280 degrees of horizontal rotation.

The components that contribute to the azimuth rotation movements shown in FIG. 7 comprise of motor 18, gear 18a, gear 20 and the turntable. Motor 18 and gear 18a are located at a central position beside the vertical center axis of apparatus 1 toward the rear as shown on base 3 to minimize the length of cable 18b to control box 21. Cables 26a and 28a are routed to the top of platform 14 (not shown) and back through support ring 20a to prevent cable entanglement with limit switches 27 and 29. Limit switch 26 is mounted twenty degrees to the left of the central rotating axis of the turntable as shown and is controlled to move counter clockwise toward stop limit bracket 27 fastened stationary to base 3 when viewed from the front. The stop limit bracket 27 is located on base 3 such that when limit switch 26 is activated, the conical frame 11 points toward the horizon where the sun rises. Limit switch 28 is mounted twenty degrees to the right of the central rotating axis of the turntable as shown and is controlled to move clockwise toward stop limit bracket 29 fastened stationary to base 3 when viewed from the front.

Conical frame 11 will rotate 280 degrees intermittently in a horizontal direction from limit bracket 27 to limit bracket 29 between sunrise and sunset controlled by sun sensor 15 (shown in FIG. 1), the azimuth electronic circuitry in tracker box 16 (shown in FIG. 3) and the azimuth twenty four hour programmable logic control in box 21 (shown in FIG. 3). The first control mode will automatically switch to the second control mode before sunrise in the spring, fall and winter days when the sun is not present to compensate for a shorter time sun path during these months. When the sun appears at any season of the year, the second control mode is switched back automatically to the first control mode for operation. The twenty four hour programmable logic will continue to run intermittently toward sunset until limit switch 28 is activated by limit bracket 29 and then return conical frame 11 in a continuous motion to limit bracket 27 in the spring, fall and winter days to compensate for the shorter time of sun during these months. Conical frame 11 will point toward the horizon where the sun rises, activating limit switch 26, ready for the next day operation cycle. However in any day when the sun appears, the second control mode will switch automatically to the first control mode. Both control modes alternate from each other to adjust for the presence or non presence of sun.

Within the above embodiments the controllers and the movement adjustments of the solar power generator have been discussed in respect of an intermittent twenty four hour chronological control. It would be apparent to one of skill in the art that the control may alternatively be based upon other measures including for example a combination of yearly time and measurement of the solar radiation for tracking the sun path.

Figure 8:
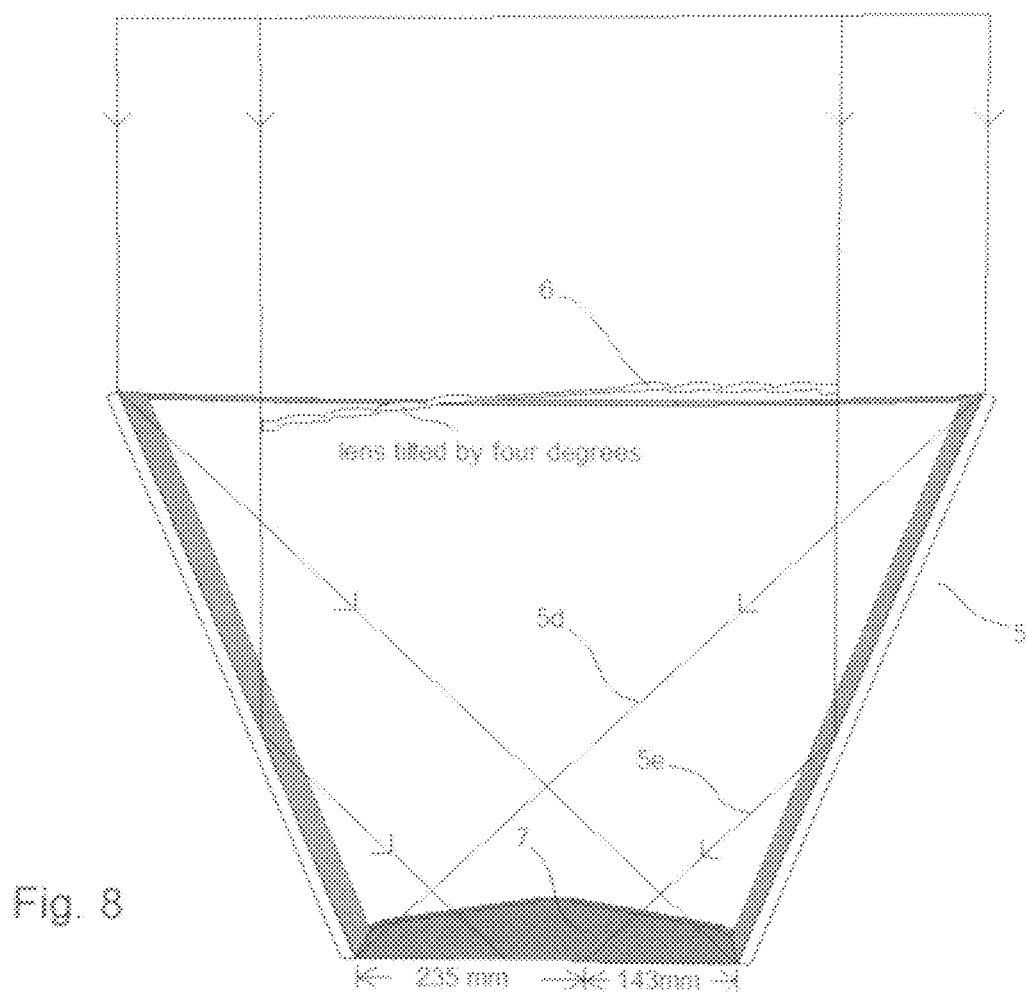
FIG. 8 depicts solar rays reflected by the conical mirror directly to the PV solar panel 7 in cross section view.

The reflected sun rays by conical mirror 5 for energy concentration on flat round PV panel 7 are shown in one half cross section diagram of FIG. 8. The incident rays for reflection travel within an air gap between the outer diameter of lens 6 and the larger outer diameter of mirror 5. Lens 6 is shown with a four degree tilt with respect to plane AA (shown in FIG. 9) of the solar panel 7. The higher the tilt of the lens, the wider the air gap between the lens and the mirror for more reflected rays onto the panel.

The incoming rays which are impinging on the inner surface of the mirror become reflected rays which then couple to PV solar panel 7.

The range of rays between reflected ray 5d and 5e fall onto a width of about 235 mm around PV panel 7. Evidence shows that this method of reflecting rays concentration increases the electrical current by more than 3 times (from 1.3 amps to 4.0 amps) compared to the same PV panel without mirror 5.

The azimuth-altitude controls of the solar power generator allows the conical mirror optical train to be orientated so that the electrical output is maintained during daily and seasonal variations of the sun's position with respect to plane A-A of solar panel 7, such that the highest possible electrical current is achieved in the smallest space without generating high temperatures.

The upper surface of PV solar panel 7 and the smaller bottom lower diameter of conical reflective mirror 5 must be mounted on the same horizontal plane A-A for three times more current magnification to occur.

As discussed supra placement of a reflective conical mirror with panels positioned at a fixed angle outward from the diameter of the solar panel will reflect solar radiation impinging upon it across the full surface area of the PV solar panel thereby capturing solar radiation concentrated outside the diameter of the PV solar panel during periods of time that the azimuth-altitude assembly has not moved the solar power generator since as described supra the controller "automatically jogs" the assembly with short intermittent movements.

For example rotation may be set as large as 2 minutes "off" and as small as 0.1 to 0.9 second "on" for each intermittent increment on a daily basis. As such the reflective assembly provides for efficient solar energy generation with periodic re-alignment of the conical frame assembly to point toward the sun.

Figure 9:
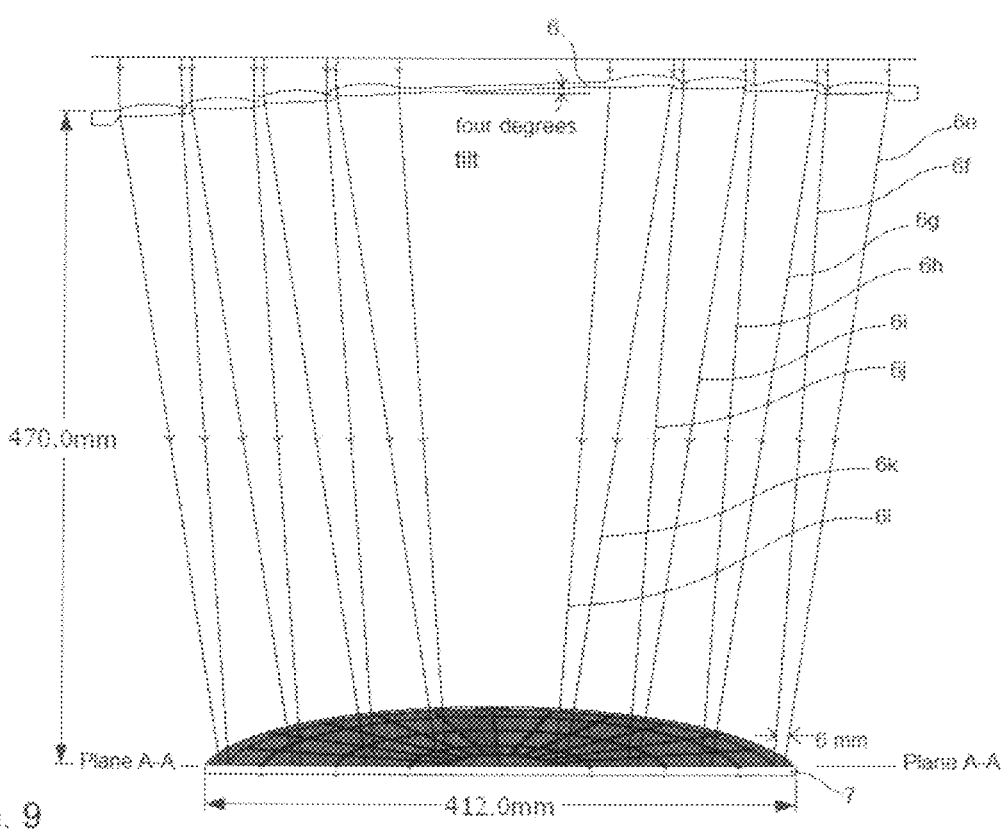
FIG. 9 depicts refracted sun rays concentration by lens 6 onto the PV solar panel 7 in cross section view.
Figure 13:
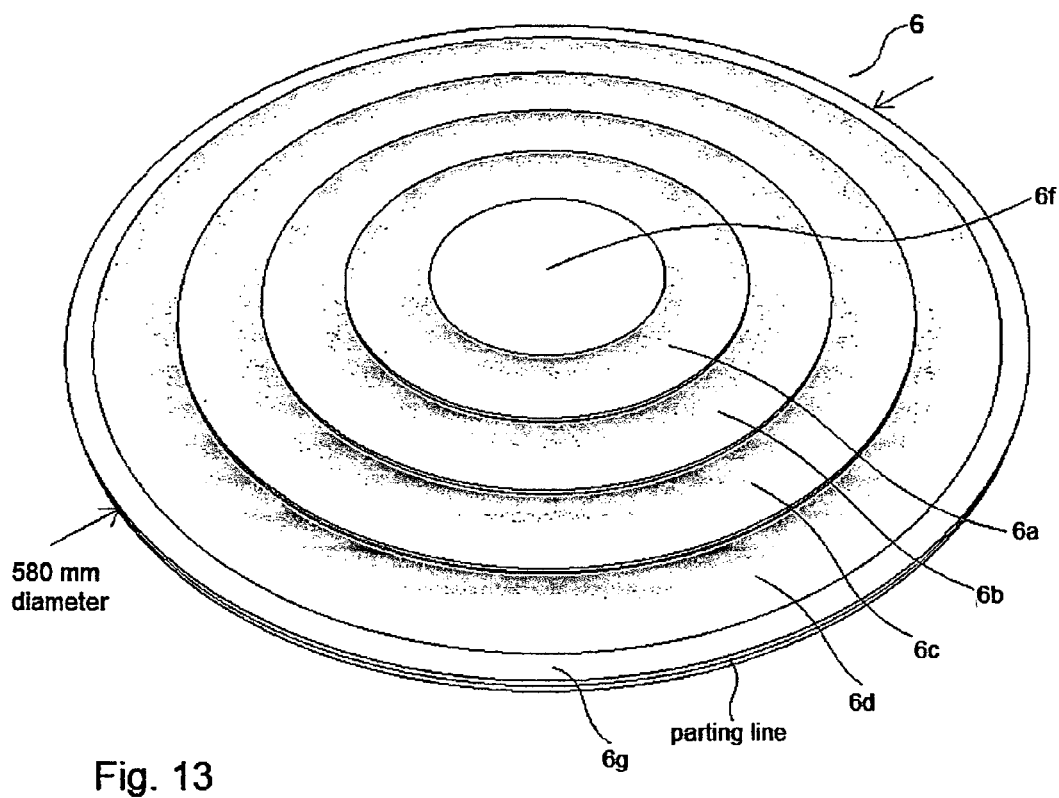
FIG. 13 depicts the top view of circular lens 6 with four long double convex rings.

FIG. 9 shows a cross section view of a refracted ray diagram for concentration of solar energy by lens 6 onto the 412 mm diameter PV solar panel 7. Mirror 5 is omitted for clarity of refracted ray illustration. The center to center distance between lens 6 (four degree tilted) and plane AA of solar panel 7 is about 470 mm. The diameter of the lens is 580 mm as shown in FIG. 13 and it is designed 40% larger than the diameter of solar panel 7 to keep the solar apparatus 1 compact in size.

As shown a first diametric axis of circular lens 6 is aligned along plane A-A of the PV solar panel 7 and then it is rotated about a second transverse diametric axis by the predetermined rotational offset of four degree tilt in either a clockwise or counter-clockwise direction. The current intensification is the same on either transverse rotational direction of the lens. The incident solar flux travels through lens 6 and refracted for concentration impinging on solar panel 7 as shown. Lens 6 has four double convex concentric rings for concentration of the sun rays. Each lens ring contributes to a concentrated luminous ring between five and six millimeter in width onto solar panel 7 as shown by refracted rays range 6e-6f, 6g-6h, 6i-6j and 6k-6l. The luminous rings are designed to fall into different non specific areas of the PV cells that form the solar panel caused by small variation of the optical alignment with the irregular intermittent movements. Evidence shows that each luminous ring increases the electrical current by twenty five percent (from 1.3 amps to 1.65 amps) in the same solar panel when compared with no lens and no mirror. The double convex arcs forming each concentrating ring segment factor into the relationship of the concentrator lens 6 and its angular offset from plane A-A parallel to PV panel 7. The lens is tilted to spread the concentrated rays to a larger near focus area of PV panel 7 thus increasing electrical current by 25% per luminous ring. The tilting of lens 6 takes advantage of a reduced projected elliptical area onto the solar panel and yet uses the whole surface area of a circular lens to pack and concentrate more sun rays toward the same area on the solar panel. The projected elliptical area of lens 6 is smaller than its circular area. It projects a larger area circular lens 6 into a smaller area of an ellipse onto solar panel 7. The result is that more sun rays can reach into a smaller area of the solar panel.

Measurement indicates that the total electrical current is doubled (from 1.3 amps to 2.7 amps) with four ring tilted lens 6. The tilt is beneficial to spread out each luminous ring to a wider area on the solar cells for power magnification. Tilting of the concentrator lens 6 is beneficially implemented with thick concentrator lenses being at least 0.3" (8 mm) thick rather than thin lenses (i.e. 0.1" (2.5 mm) thick or less). Thin lenses of the prior art are not beneficial for the present invention. Similarly the silicon wafers in contrast to the trend discussed supra should be beneficially thick at 300 µm minimum thickness, allowing good dissipation of heat generated through glass substrate 7f and aluminum back plate 7g. Further, it is beneficial to not include any plastic encapsulation, even if clear, due to the increase in temperature and potential long term degradation of the plastic due to high electrical current and ultraviolet radiation.

In operation the plurality of lens sections provide a series of luminous rings on the PV panel which contribute to increase in electrical output current (25% increase per luminous ring) and a series of dark rings in between the luminous rings which do not. Accordingly an increase in output can be achieved by rotating the lens with respect to plane A-A of PV panel 7 such that these luminous rings are distributed to a wider area at the PV panel.

Figure 9A:
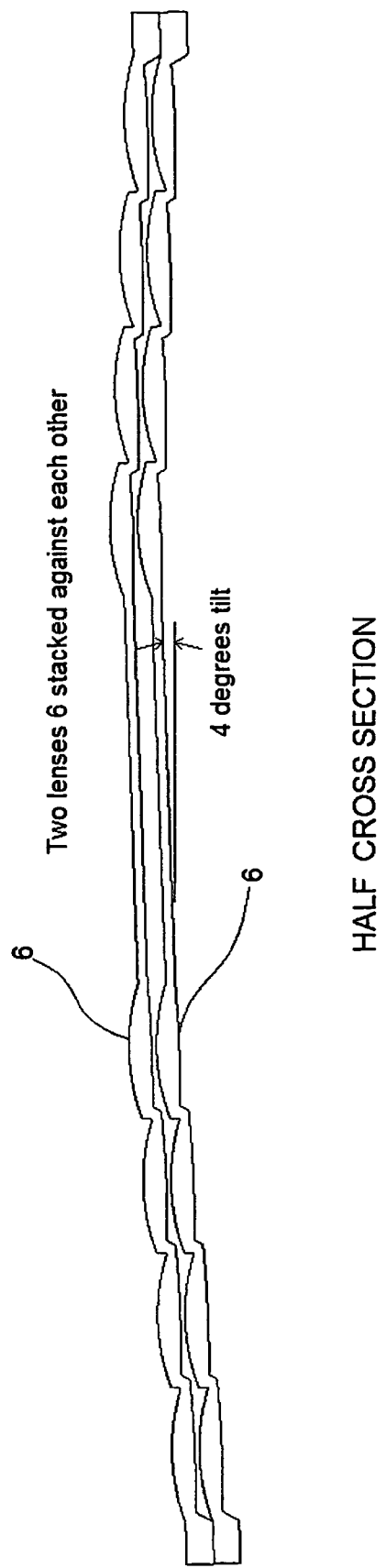
FIG. 9a illustrates two lenses 6 stacked against each other for concentration.

Two lenses 6 can form part of a stacked lens assembly as shown in FIG. 9a to reduce the separation distance by 40% required between the lens assembly and the solar panel compared to apparatus 1, thus making the apparatus even more compact and yet provide substantial beneficial concentration.

Figure 10:
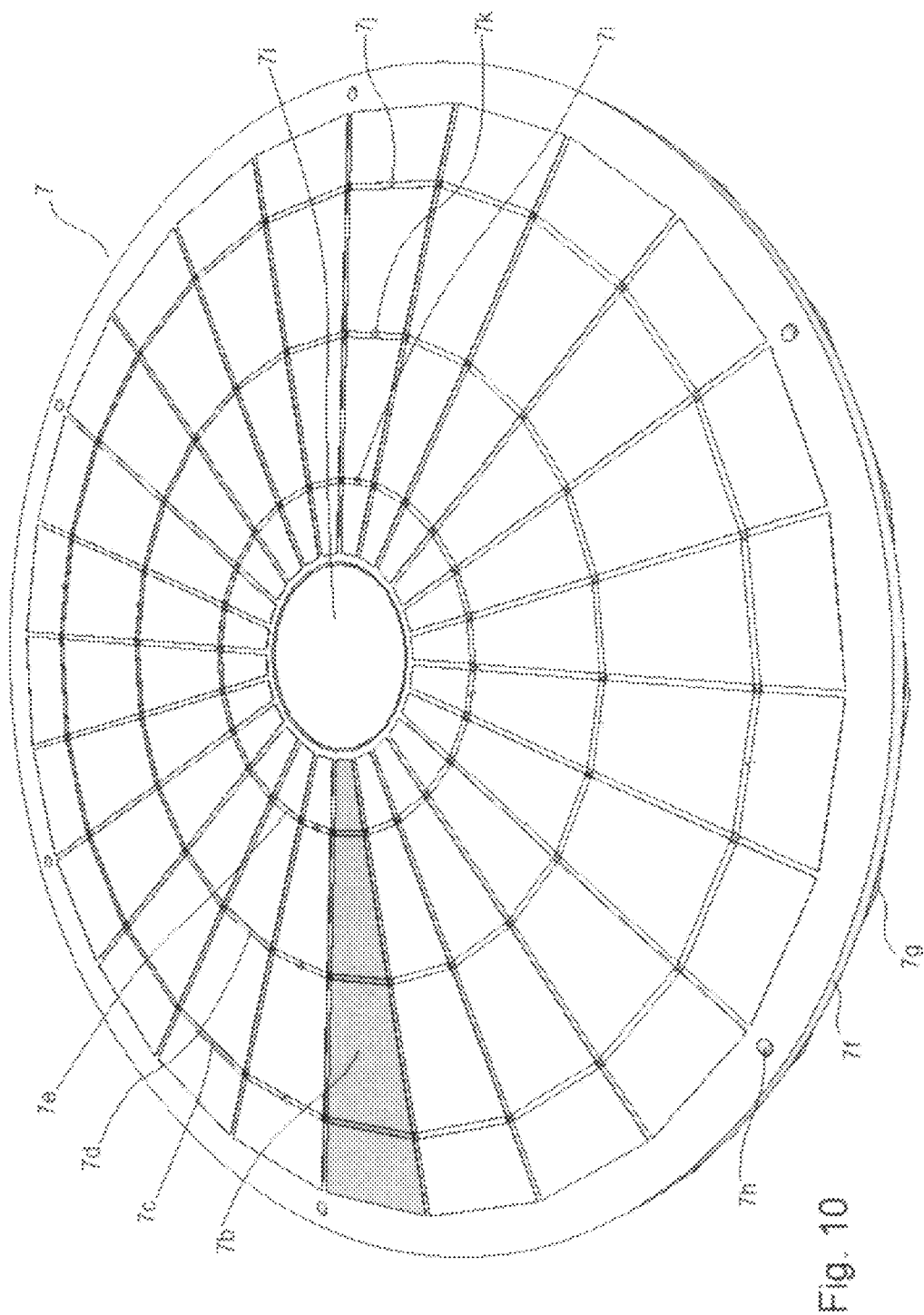
FIG. 10 shows a top view depicting the structure of PV solar panel 7.

Solar panel 7 shown in FIG. 10 is constructed with twenty four mono-crystalline silicon wafer cells 7b of 300 micron thick each. Each fan shape cell 7b is placed around a round glass or ceramic electrical insulator substrate 7f (412 mm diameter×6.35 mm thick) to form solar panel 7. All twenty four cells 7b terminals within are connected in series, the starting cell provides the positive output terminal and the ending cell provides the negative output terminal. Each cell is rated at nominal 0.55 volt and 1.1 watts (at one full sun without solar flux concentration or power magnification) providing a total of 13.2 volts DC and 26.4 watts for solar panel 7.

Tab wires 7c, 7d and 7e connect each adjacent cell 7b in series forming three strings for solar panel 7. The width of each ribbon tab wire is two mm. In another embodiment of the invention Cell 7b can be of the multi-junction PV type with a nominal rated volt of 3 volts DC each, providing 72 VDC with 24 cells. All cells 7b are spot supported throughout against vibration with silicon rubber adhesive between the bottom of each cell and top of substrate 7f. Substrate 7f is in turn mounted to aluminum back plate 7g as shown. The PV cells are mounted to a non-conductive insulator ceramic plate or glass 7f which in turn is mounted to an aluminum circular mount plate 7g.

Center round disc 7i is made of cast iron, aluminum or beryllium copper to serve as a passive heat sink, its dimension is sixty six mm in diameter by six mm thick. Disc 7i goes through insulator glass substrate 7f and fastened in full contact with aluminum plate 7g to provide good heat conduction and adequate rate of heat withdrawal.

There are six mounting holes 7h (4.8 mm diameter each) around the outer perimeter of the solar panel for fastening substrate 7f to back plate 7g and fixing solar panel 7 to bottom of members 10, 10a and 10b of conical frame 11. Wiring holes 7j, 7k and 7l are used to bring the positive and negative output terminals to the rear of solar panel 7 into terminal box 7a. Holes 7j, 7k and 7l are drilled or punched with a generous three millimeter diameter each to allow adequate clearance for heat expansion/contraction of the PV cells and tab wires and prevent cracking.

In another embodiment of the invention, the desired total voltage output from the solar panel could be obtained through the use of an external voltage multiplier connected to the solar panel for different applications that require more than 13.2 volts DC.

The top view of FIG. 10a shows tab wires 7c, 7d and 7e soldered to the negative side of cell 7b at the top (side of the cell facing the sun). The other half of tab wires 7c, 7d and 7e continue to the adjacent cell and is soldered to the positive side of the cell at the bottom. The continuation of tab wire 7c is soldered to the positive side of the adjacent cell at 7cb, likewise continuation of 7d is soldered to 7db and continuation of 7e is soldered to 7eb. Successive soldering of adjacent cells 7b in series forms 3 strings of tab wires that connect all twenty four cells 7h to make solar panel 7.

Figure 10B:
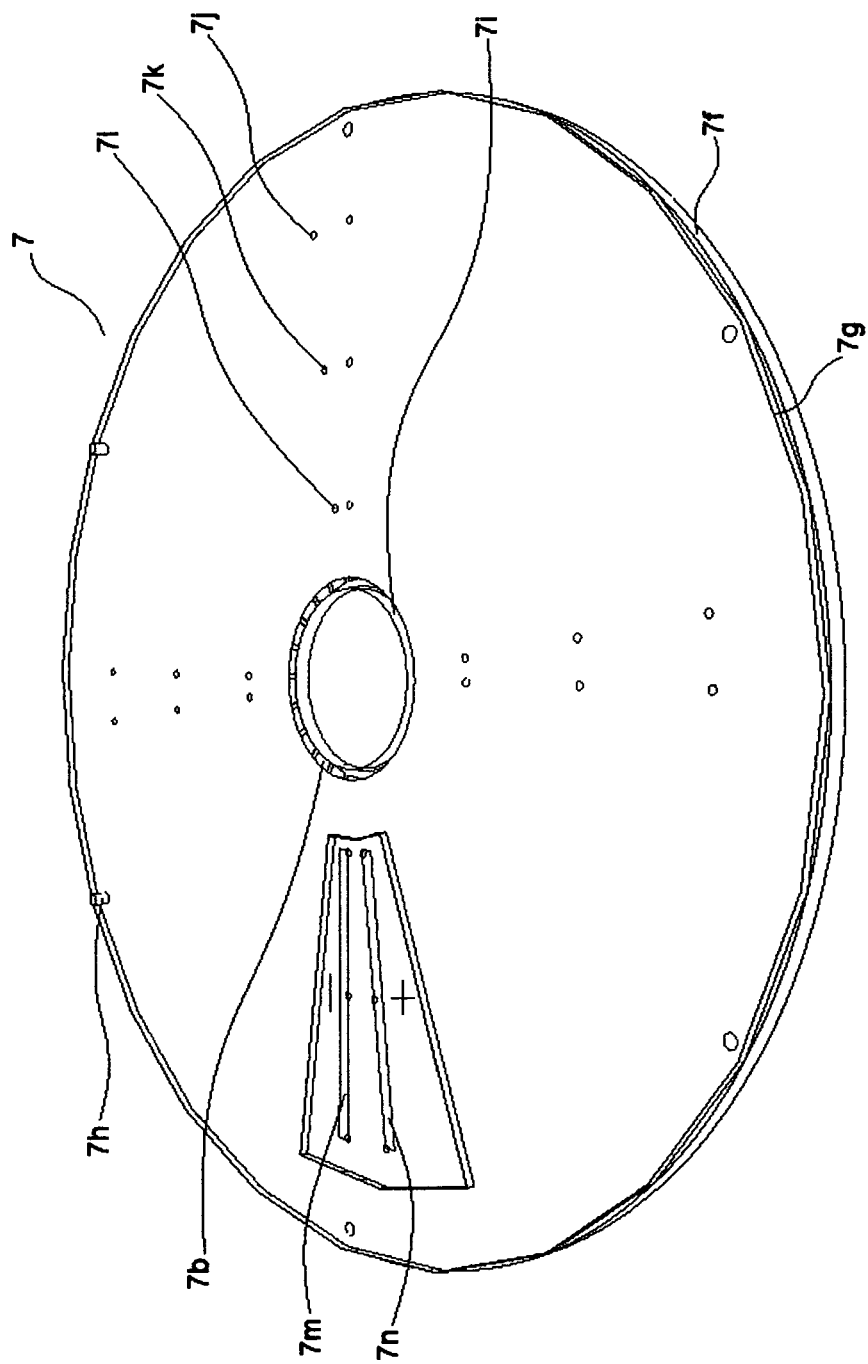
FIG. 10b depicts the rear view of PV solar panel 7 with mounting holes.

The rear of solar panel 7 is shown in FIG. 10b. A cut out through aluminum back plate 7g (412 mm diameter×3 mm thick) exposes the positive terminal 7n and the negative terminal 7m of the solar panel. Metal center disc 7i is mechanically fastened (not shown for clarity) to back plate 7g for good heat sink conduction. Eight 7j holes, eight 7k holes and eight 7l holes are diamond drilled or formed through glass or ceramic back plate 7f in the pattern as shown. Two sets only of 7j, 7k and 7l holes on aluminum plate 7g allow the ends of the three strings of tab wires to exit at the rear of the solar panel and soldered respectively to terminals 7n and 7m. Six holes 7h go through back plate 7g and insulator glass plate 7f for mechanically fastening of these plates that form the solar panel.

Figure 11:
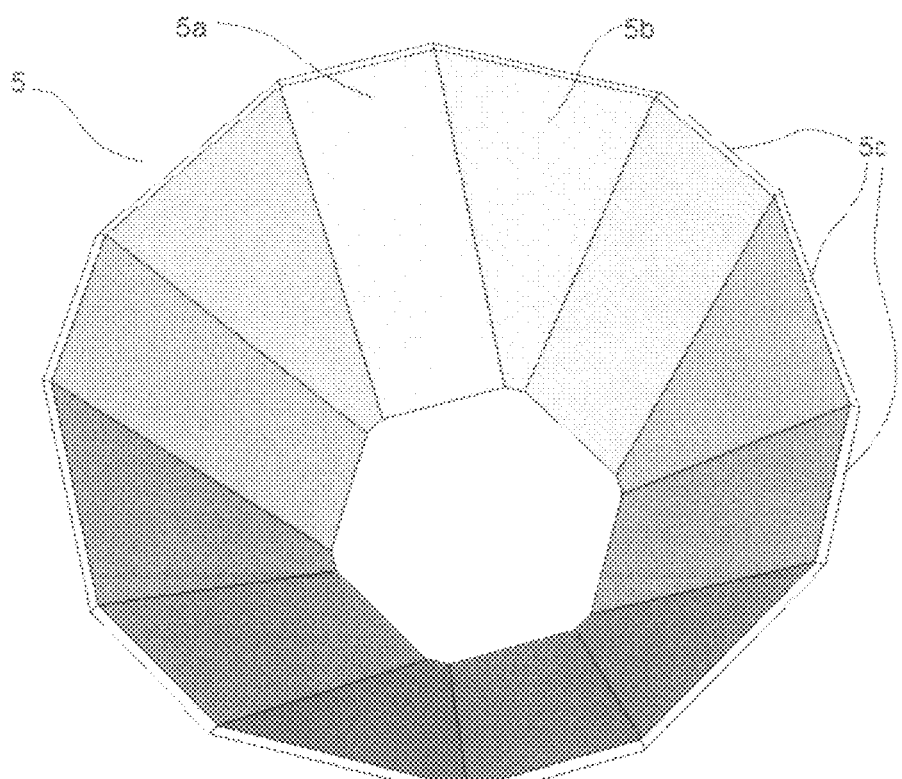
FIG. 11 is a top isometric view of the 12 sided conical mirror 5 showing two types of flat mirror panel segments.

FIG. 11 is an isometric top view of twelve sided conical mirror 5. There are six rectangular mirror panels 5a joined alternately to six trapezoidal mirror panels 5b as shown to form a truncated cone. Each mirror panel is made with aluminum coated plastics PETG sheet and backed with a three quarter inch thick polyisocyanurate foam insulation board 5c of the corresponding shape. The bottom of the conical mirror has six straight long segments and alternated with six straight short segments that surround the PV cells of round solar panel 7 in close proximity at plane AA. Preferably a separation distance of two millimeters or less is used between a rectangular mirror panel 5a at the bottom of the conical mirror (in touch with plane AA) and the perimeter of the outer diameter formed by PV cells 7b for beneficial sun rays concentration by reflection. Evidence shows that the slope length of mirror 5 is about twice the diameter of solar panel 7 to achieve three times electrical current magnification. Conical mirror 5 of apparatus 1 contributes 75% (600 watts hour) of the total electrical power daily.

Figure 11A:
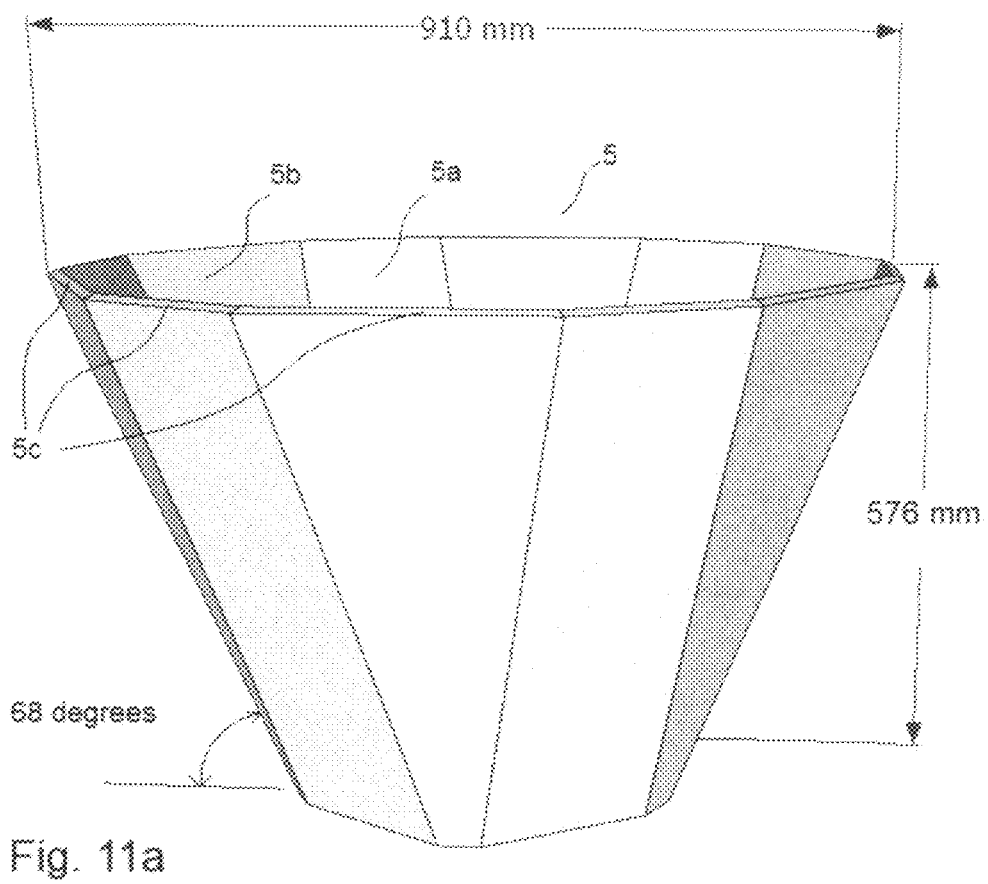
FIG. 11a shows a front isometric view of the 12 sided conical mirror with proven beneficial dimensions.

The dimensions of conical mirror 5 are shown in FIG. 11a. The top outer diameter is 910 mm, the height of the cone is 576 mm and the angle of panels 5a and 5b is 68 degrees with respect to plane AA as shown; this is equivalent to 22 degrees outward from the perpendicular axis between the center of the solar panel and the center of the lens. The bottom inner diameter of mirror 5 is about 378 mm (shown in FIG. 8 as 235 mm+143 mm).

Figure 12:
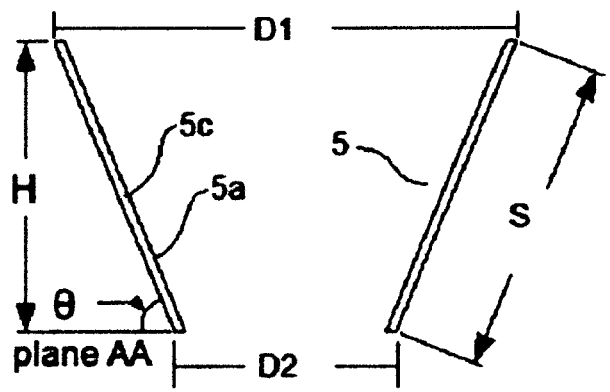
FIG. 12 defines a cross section of the geometry of conical mirror 5.

Labelling for twelve sided conical mirror 5 calculation is shown in FIG. 12. Angle theta, $\theta$ between horizontal (plane AA) and slope S of cone panel 5a or 5b is between 60 and 75 degrees found empirically for approximately 3 times electrical current increase due to reflection of sun rays The length of the side wall of the cone is given by Equation (1) below where S is the slope length of side wall of the mirror. D1 is the top outer diameter of conical mirror 5 and D2 is the diameter of solar panel 7. H, the height of the truncated cone mirror is given by Equation (2).

The lower diameter of the truncated cone of the mirror matches the outer diameter made by the PV cells on the solar panel closely to achieve approximately 3 times electrical current increase due to reflection of sun rays.

$$(D1-D2)/2 = S \times \cos\theta \qquad (1)$$

$$S = H/\sin\theta \qquad (2)$$

Example: S=(910−445)/(2×Cos 68)=621 mm H=621×Sin 68=576 mm

A four ring circular lens 6 of 580 mm in diameter is shown in FIG. 13. Lens 6 is comprised of double convex concentric rings 6a, 6b, 6c and 6d stepping outward in sequence from the center of the lens for concentration of sun rays by refraction. The whole lens is injection molded with one clear material as described supra.

FIG. 13a shows the same lens 6 in half cross section. The center of lens 6 is a round disc 6f of non critical flat uniform thickness. Rings 6a to 6d are connected to the round center disc 6f and step down toward the outer perimeter ring 6g as shown. Ring 6d is connected to the lens outer ring 6g of rectangular cross section. The circular outer ring 6g is for mounting onto members 10, 10a and 10b of conical frame 11. The overall height of lens 6 is 24.3 mm.

Figure 13B:
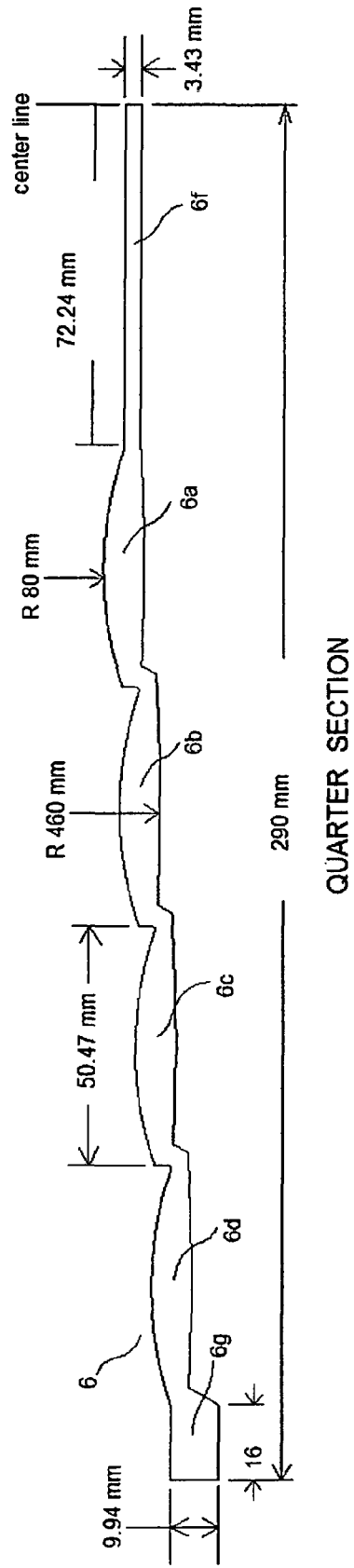
FIG. 13b shows one quarter cross section of lens 6 with radii of curvatures for each ring segment and other essential dimensions.

A quarter section of lens 6 is shown in FIG. 13b. Each of rings 6a, 6b, 6c and 6d is made of a long top convex arc of 50.47 mm in width and 80 mm in arc radius. Each long bottom convex arc of rings 6a, 6b, 6c and 6d is about 50 mm in width but 460 mm in arc radius. The top and bottom arcs for each ring must be designed with long length (long as treated by this invention) to achieve the claimed amount of sun rays concentration. Evidence shows that when the lens is tilted, the electrical current intensified by each of rings 6a to 6d is increased by 25% when compared with the same mono crystalline silicon solar panel 7 at one full sun without concentration. As a result the total increase in electrical current from the mono crystalline silicon solar panel 7 is 100% by lens 6 alone without mirror 5. Circular lens 6 of apparatus 1 contributes 25% (200 watts hour) of electrical power generation daily when the sun is present.

The center disc 6f is a planar core of 72.24 mm radius by 3.43 mm thick. The four double convex rings progress outwardly and step sequentially away from the planar core 6f terminating in lens mounting ring 6g. The circular outer ring 6g for mounting of lens 6 is of rectangular cross section, 16 mm wide by 9.94 mm thick. Planar core 6f can alternatively be an opened hole allowing the first wavelength rays to reach the PV solar panel directly. The radius of lens 6 is 290 mm.

Half of the long top convex arc and half of the long bottom convex arc of each concentrating lens ring section 6a to 6d are defined by an ordinary general curve differential equation (3) below of order one, degree one, with independent variable x and dependent variable y as shown by curve 141 in FIG. 14.

$$x\,dy/dx - 2y = 0 \qquad (3)$$

Lens equation (3) has x as the independent variable along height of a concentrating lens ring transverse cross section and y the dependent variable along the width of the same lens ring transverse cross section.

Equation (3) defines the x and y positions for one half of the arc width on top or bottom of each concentrating ring transverse cross section.

Where:

$$y = Ax^2 \text{ for } x \geq 0 \qquad (4)$$

$$y = Bx^2 \text{ for } x \leq 0 \qquad (5)$$

A and B are constants with magnitude ranging between 0 and 1. A and B constants are chosen to fit the concentrating lens ring arcs for an empirically obtained optimum curve shape geometry. This specific lens geometry achieves electrical current increase of 25% for the solar panel contributed by each concentrating lens ring 6a, 6b, 6c or 6d. The total contribution to electrical current increase is 100% by lens rings 6a, 6b, 6c and 6d.

Example 1: at x=1mm, A=0.39 and B=0, Therefore y=Ax²=0.39 for x≥0 and y=0 for x≤0

Example 2: at x=8 mm, y=Ax²=25 mm when A=0.39

Example 3: at x=6.5 mm, y=Ax²16.48 mm when A=0.39

Example 4: at x=4 mm, y=Ax²6.24 mm when A=0.39

Figure 14A:
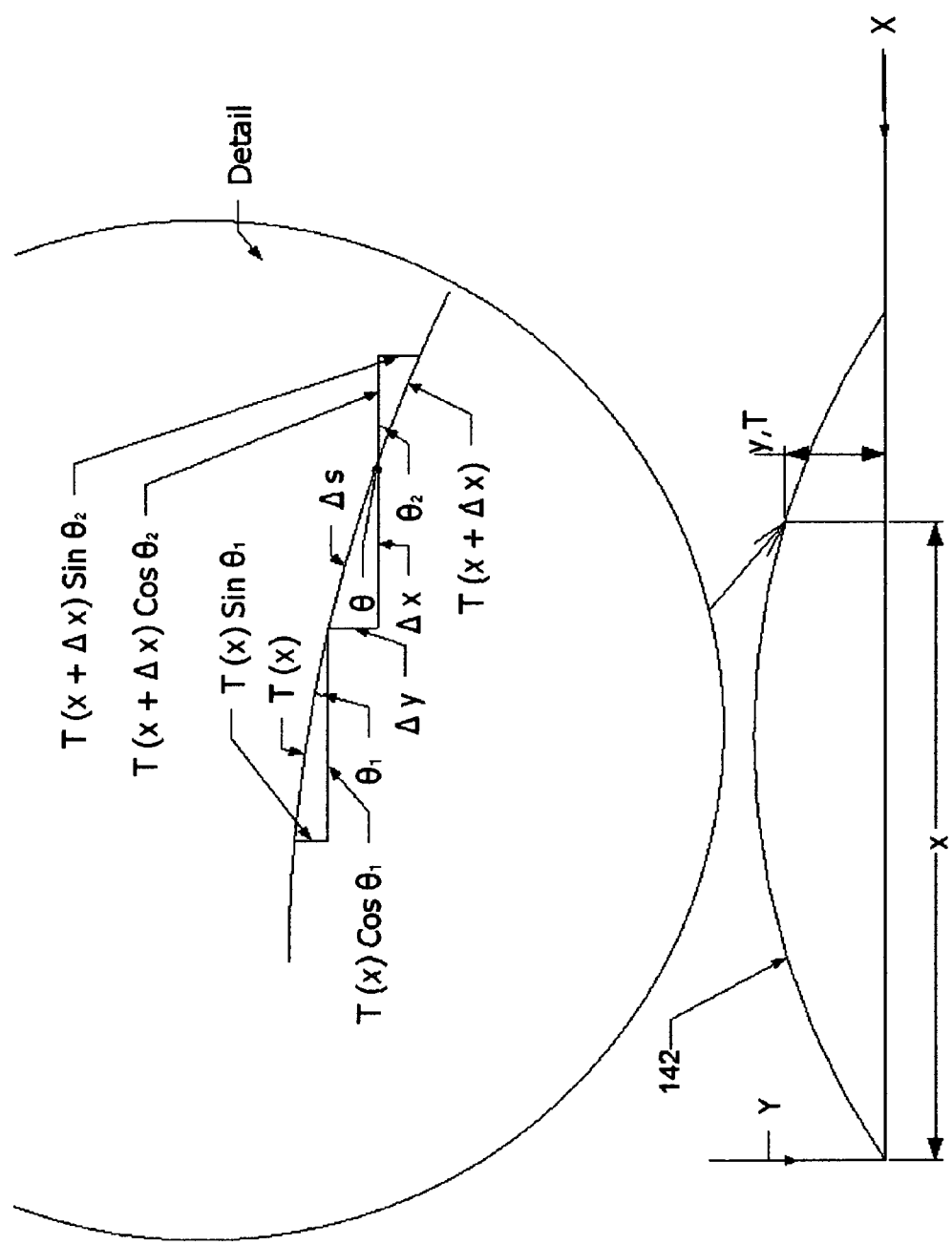
FIG. 14a defines the top or bottom arc of each concentrating ring transverse cross section with a standard wave partial differential equation, curve 142.

Alternatively the whole long top or long bottom convex arc of each concentrating lens ring transverse cross section 6a, 6b, 6c or 6d can be represented by a standard "wave" partial differential equation (6) below for an analogous vibrating string of order two, degree one, independent variables t, x and dependent variable y as shown by curve 142 in FIG. 14a.

$$\frac{\partial [T(x)\partial y/\partial x]}{\partial x} = \frac{c\partial^2 y}{\partial t^2} \qquad (6)$$

Equation (6) defines the top or bottom geometrical shape of the convex arc at each concentrating lens ring transverse cross section. The independent variable x is along the width of respective concentrating lens ring transverse cross section, t is the independent time analogous variable along height of respective lens ring transverse cross section, analogous or proportional to y, and c is a material coefficient equal to one, y is the dependent variable along height of respective lens ring section and T is the net vertical analogous upward force (equal to Δy assuming that t is directly proportional to y).

The maximum size of this analogous force is equivalent to the maximum height of the respective convex arc.

Figure 14B:
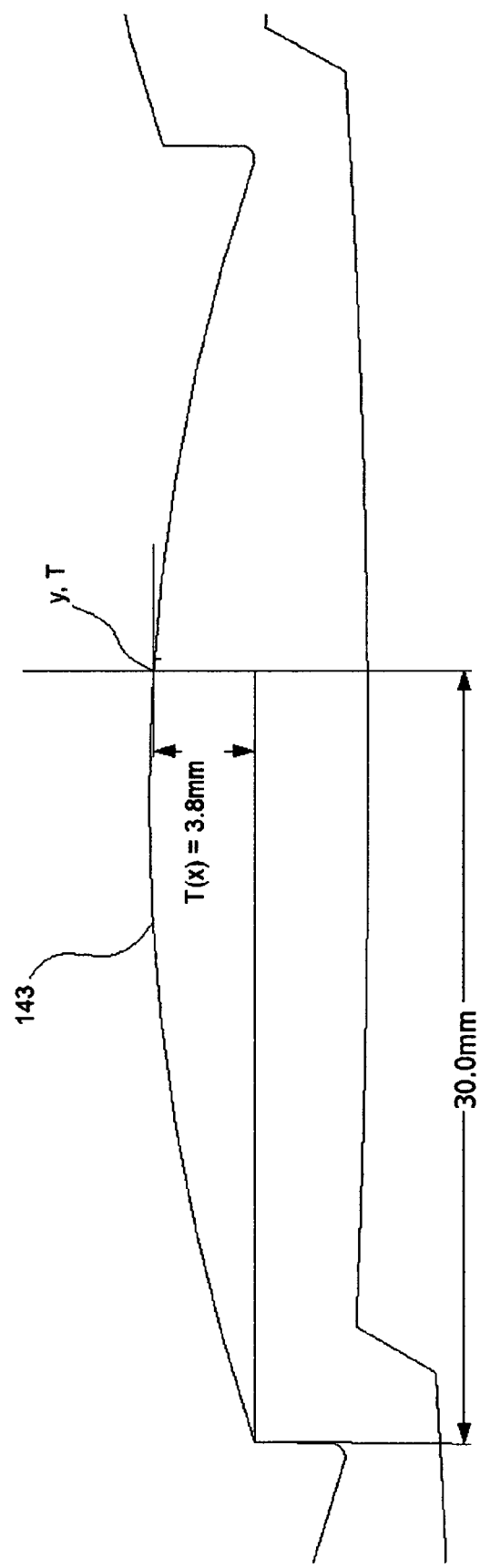
FIG. 14b shows curve 143 and a point on the top or bottom arc of each concentrating ring transverse cross section by finite element analysis.

The result of the finite element analysis by increments for equation (6) is given by Equations (6a) and (6b) below as shown by curves 143 and 144 in FIGS. 14*b* and 14*c* respectively, wherein x is the independent variable along width of respective lens ring transverse cross section, Δx an infinitesimal increment in x, θ the angle which the tangent at any point of the wave makes with the positive x direction, $\theta_2$ the angle of the tangent to the right of a point in the wave with the positive x direction (between the arc of respective lens ring section and the fix intersection of an analogous vibrating string in the x direction on the right) and $\theta_1$ the angle of the tangent to the left of the same point above in the wave with the positive x direction equal to $(\theta - \theta_2)$ $$T = t(x + \Delta x)\sin\theta_2 - T(x)\sin\theta_1 \qquad (6a)$$

Using appropriate boundary conditions x≥0 and y≥0 for each lens ring transverse cross section then the height of the top convex arc of the lens ring is given by Equation (6b) below where y is the height of the top convex arc of the lens ring transverse cross section at any point.

$$y = T(x + \Delta x) - T \qquad (6b)$$

Curve 144 in FIG. 14*c* represents a transverse cross section of top convex arc of lens ring 6*c*.

Curve 145 in FIG. 14*c* represents a transverse cross section of respective bottom convex arc across the width of the arc.

Each top or bottom convex curve is defined independently by equations (6), (6a) and (6b).

Example : From the top convex arc geometry of lens ring 6*c* at a transverse cross section as shown in FIGS. 14*b* and 14*c*. $\theta_1$=4.4 deg., θ=4.5 deg., $\theta_2$=4.6 deg., x=30 mm, Δx=0.5 mm, Δy=0.0394 mm, T(x)=3.8 mm and T(x+Δx)=3.8394 mm By combining equations (6a) and (6b), T(x+Δx)−y=T(x+Δx) sin $\theta_2$−T(x) sin $\theta_1$, y is therefore 3.8394−3.8394 sin 4.6+3.8 sin 4.4=3.823 mm for x≥0 and y ≥0

Similar analysis as above can be used to calculate the height of the respective bottom convex lens ring section.

Figure 15:
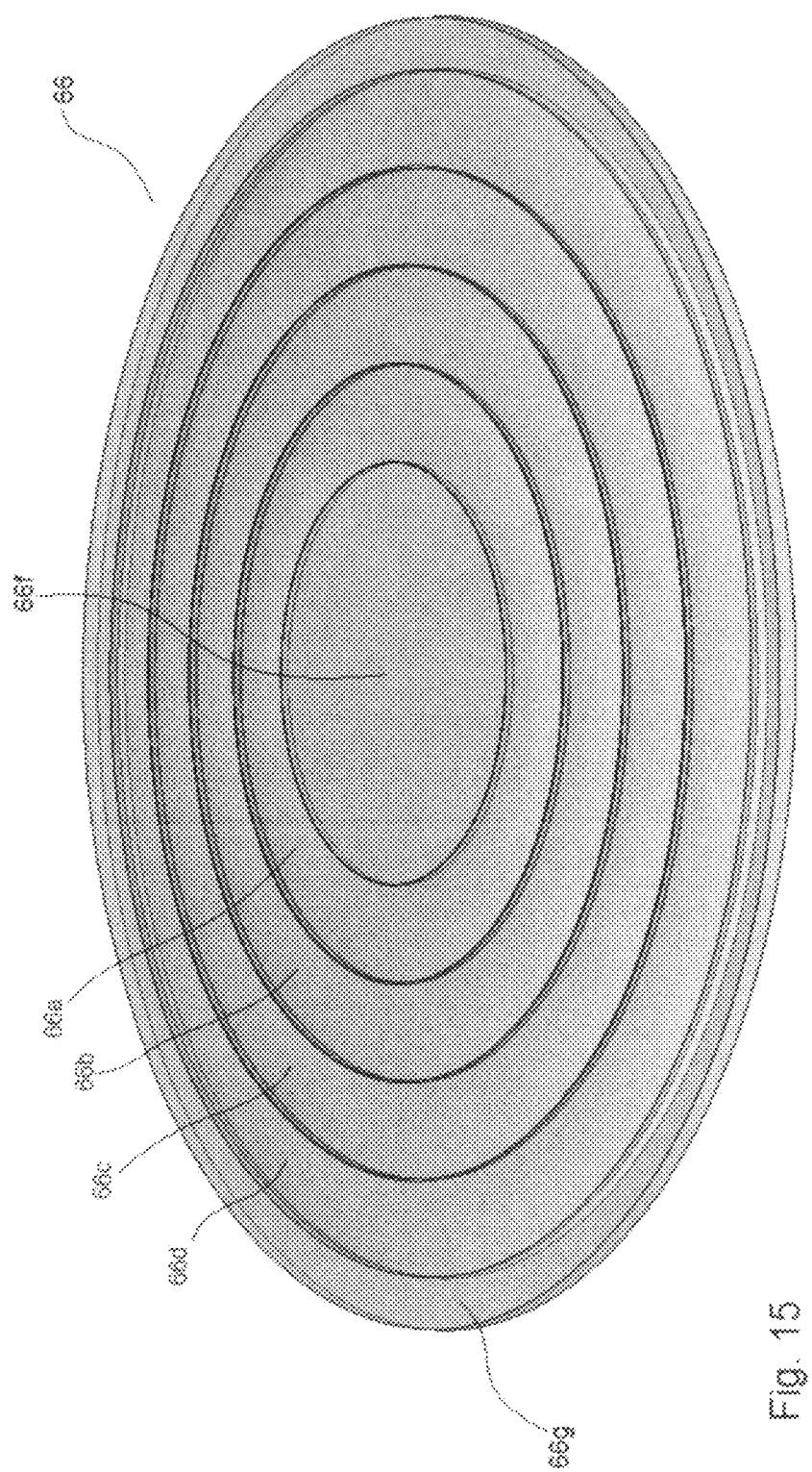
FIG. 15 depicts the top view of an alternate curvilinear lens 66 with four gradually tilted long double convex segments.

Another embodiment of a circular double convex lens is shown in FIG. 15 as lens 66. The round lens is curvilinear and composed of four concentric double convex rings 66*a*, 66*b*, 66*c* and 66*d* that are gradually rotated downward from the center toward the PV panel. Center disc is labelled with 66*f* and outer mounting ring is 66*g*. Lens 66 allows the separation distance between the lens and the solar panel to be smaller compared to the corresponding distance in apparatus 1 with lens 6. Also dome 2 can be made smaller with lens 66.

Figure 15A:
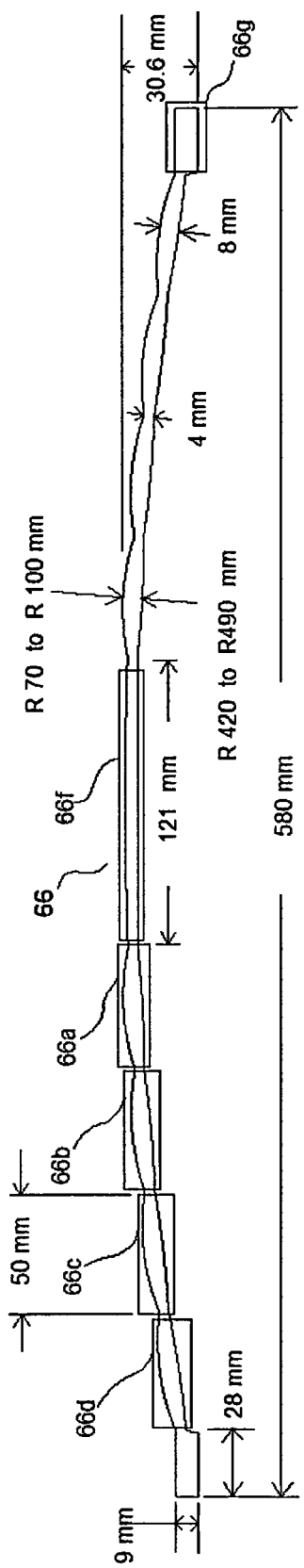
FIG. 15a depicts one half cross section of lens 66 detailing the shape of each of the four long double convex ring segments with essential dimensions.

A half cross section of lens 66 as shown in FIG. 15*a* indicates that the lens starts with a center disc segment 66*f* of 121 mm in diameter. Concentric lens ring sections 66*a*, 66*b*, 66*c* and 66*d* are connected in rotated sequence from the center disc. Each concentrating lens ring section is 50 mm wide, 8 mm thick between the apexes of the double convex ring arcs and 4 mm thick at each end of the arcs as shown. The top convex arc of each ring section is between 70 mm and 100 mm in radius. The bottom convex arc of each ring section is between 420 mm and 490 mm in radius. Each of rings 66*a*, 66*b*, 66*c* and 66*d* is rotated to form an arc spanning across the whole 580 mm diameter lens of 30.6 mm overall arc height as shown in FIG. 15*a*. Ring 66*a* is rotated downward toward PV panel 7 from center disc by three degrees. Ring 66*b* is rotated downward toward PV panel 7 from the joint with ring 66*a* by 4.7 degrees. Ring 66*c* is rotated downward toward PV panel 7 from the joint with ring 66*b* by 6.5 degrees. Ring 66*d* is rotated downward toward PV panel 7 from the joint with ring 66*c* by 8.2 degrees. The result is that the lens sections follow an overall arc such that each ring section is gradually rotated from the center of lens 66.

These ring rotations allow the luminous rings for concentration to be closer to each other onto the solar panel. If the rings are not rotated then the disadvantage is ending up with a larger lens diameter to the detriment of achieving a compact size apparatus. Evidence shows that these ring rotations contribute to the intensities of the resultant luminous rings at the solar panel. The circular perimeter ring 66*g* is used for mounting and it has a rectangular cross section of 28 mm in width and 9 mm thick.

Figure 16:
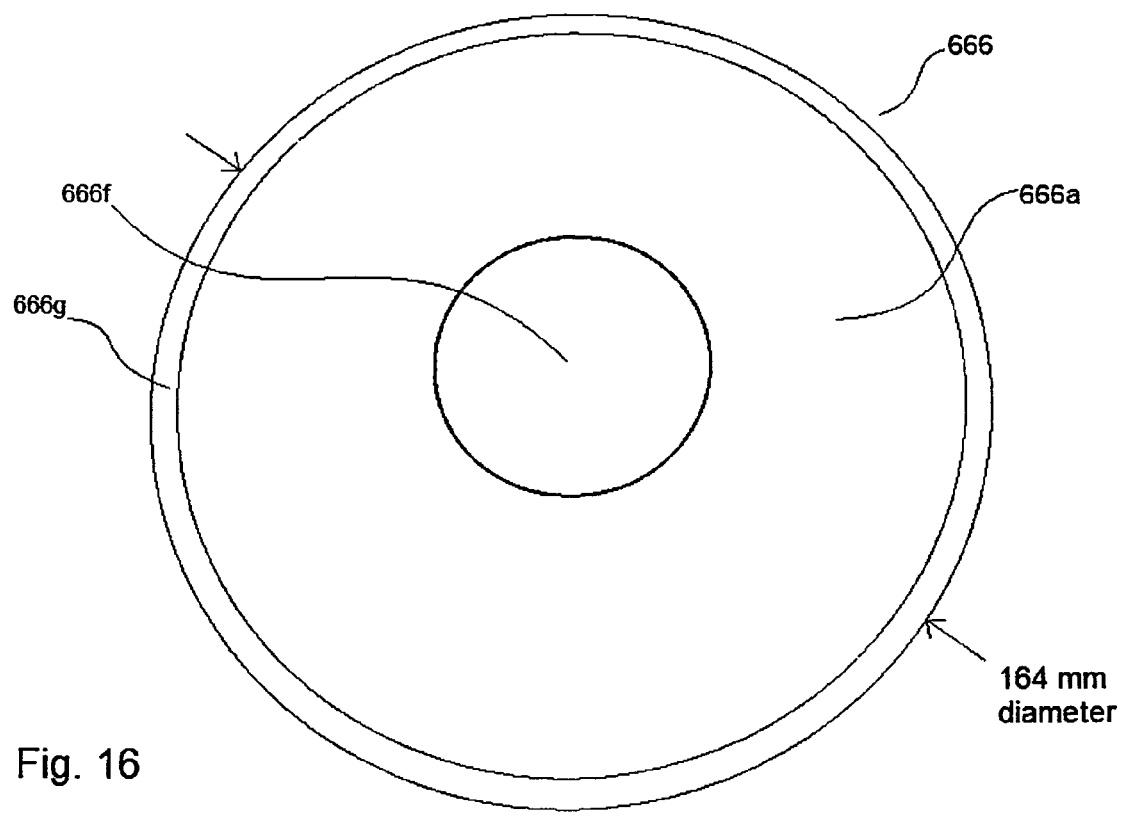
FIG. 16 depicts a top perspective view of lens 666 with one double convex ring.

Yet another embodiment of a circular double convex lens is shown in top isometric view FIG. 16 as lens 666 with an overall diameter of 164 mm. Lens 666 has only one concentrating ring segment 666*a* and is suitable for a smaller flat round PV panel 77 shown in FIG. 16*c*, preferably made with four small multi-junction cells arranged in a circular pattern. As discussed supra by carefully increasing the concentration power of the lens at a desired level in a controlled manner and rotating the lens, for example at an angle toward 25 degrees off axis with respect to the plane parallel to the PV solar panel 77, the current from the PV solar panel 77 can be increased significantly avoiding thermal degradation. Solar panel 77 is allowed to run at lower temperatures.

Figure 16A:
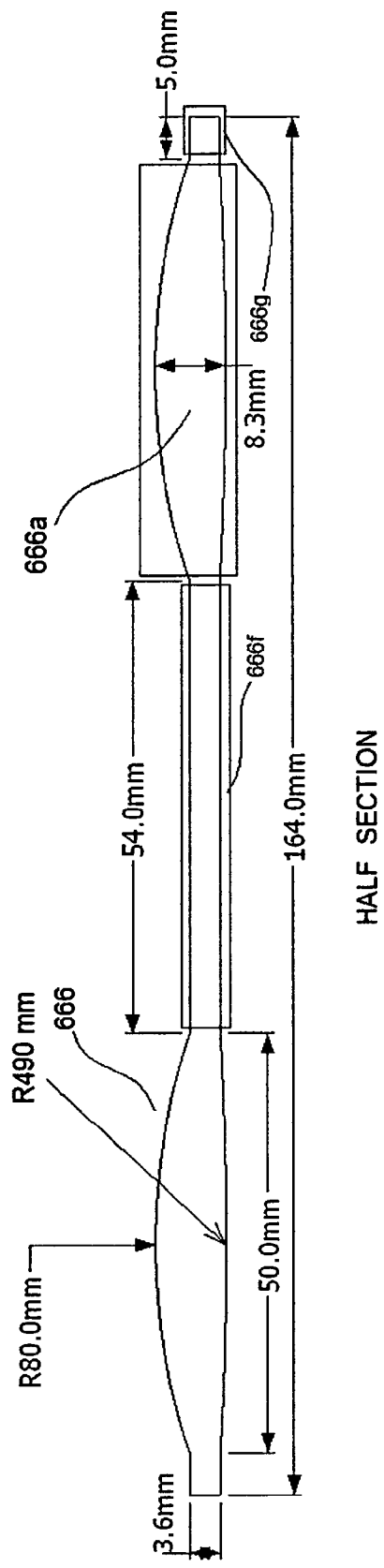
FIG. 16a depicts one half cross section of lens 666 with top and bottom radii of curvatures for each ring segment and other essential dimensions.

A half cross section of lens 666 is depicted in FIG. 16*a*. Lens 666 is not curvilinear but relatively flat overall and consists of a round 54 mm diameter center disc 666*f* that connects to a double convex ring 666*a*. Ring 666*a* is 50 mm wide, 8.3 mm thick between apexes of top and bottom convex arcs and 3.6 mm thick at each end of the arc. The top convex arc has a radius of 80 mm and the bottom convex are has a radius of 490 mm. The circular perimeter ring 666*g* is for mounting purpose and has a rectangular cross section of 5 mm in width and 3.6 mm thick.

Truncated conical mirror 55 is illustrated in FIG. 16*b*. The slope length of the mirror is 90 mm, at twice the diameter of PV panel 77 for 2.5 times increase in electrical current. The angle of inclination of the panels that form mirror 55 is 68 degrees with respect to plane B-B of PV panel 77.

Figure 16C:
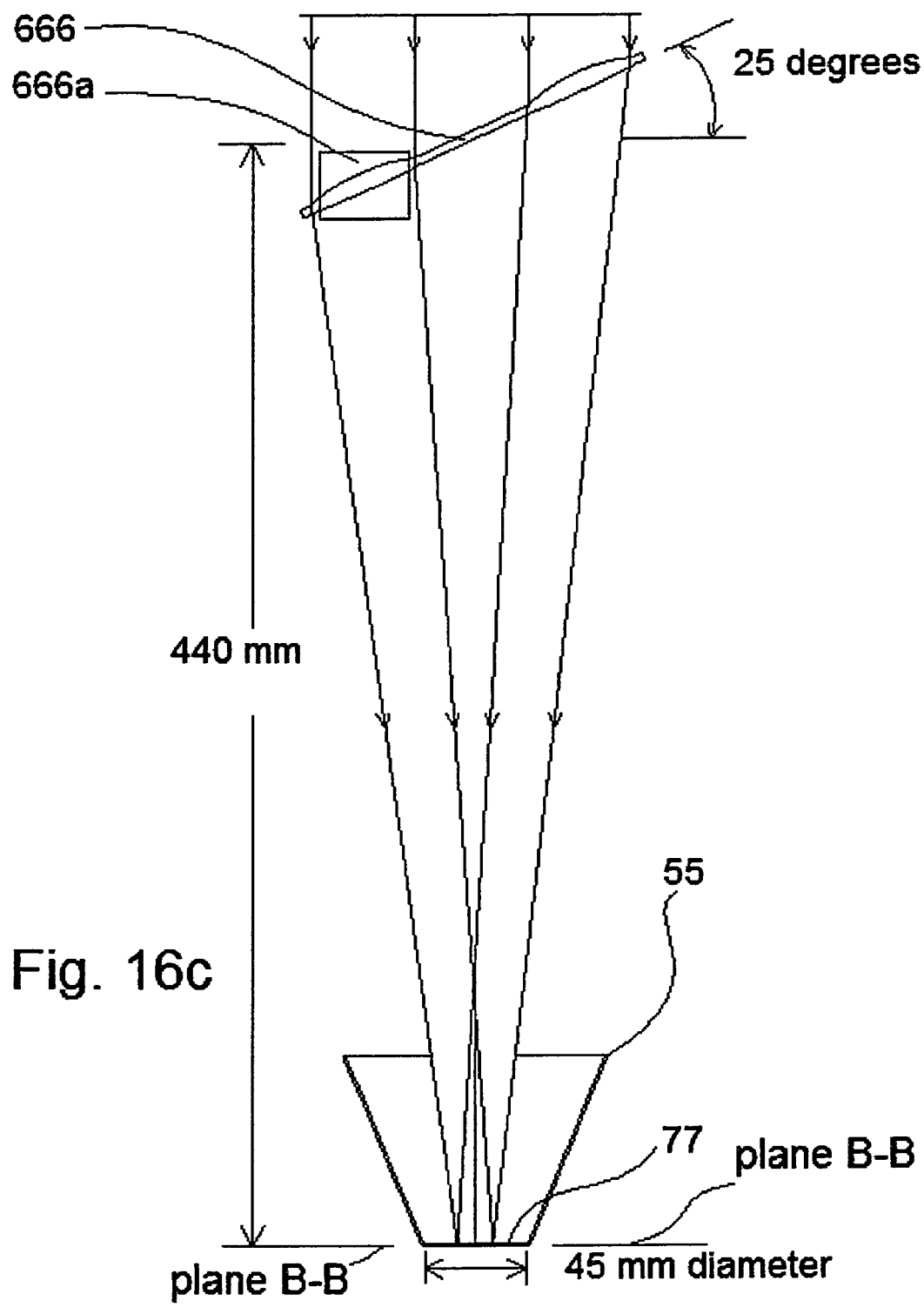
FIG. 16c depicts a refracted sun rays concentration diagram by lens 666 onto PV solar panel 77 in cross section view for more than six times increase in electrical current. Mirror 55 is shown in operation with lens 666 and PV panel 77.

A ray diagram of a tilted lens 666 by twenty five degrees with respect to Plane B-B of PV solar panel 77 is described in FIG. 16*c*. Solar radiation travels through lens 666 and concentrates on a 45 mm diameter PV solar panel 77. The distance of separation between the center of lens 666 and the PV solar panel 77 is 440 mm. Ring segment 666*a* refracts a range of sun rays toward the center of the PV panel 77 forming a kidney shape luminous ring covering ⅓ of the solar panel surface area at the center. The generated photocurrent from the PV solar panel is significantly increased by rotating the lens 25 degrees away from the parallelism of plane B-B.

Evidence shows that the electrical current is increased by four times when compared to the same panel at one full sun without concentration of the solar energy. However the advantage of the electrical current increase was diminished to two times increase only when lens 666 was not tilted and it was rotated back parallel to Plane B-B of the solar panel 77.

Rotating the concentrator lens out of the plane taught by the prior art provides for a reduction in the projected area of the lens onto the PV solar panel and resulting in more rays concentrated compared to no rotation of the lens. The distance between lens and PV panel is beneficially shortened by 40% with a tilted lens as opposed to a parallel lens for the same optical concentration. Tilting the concentrator lens results in a reduction in the dark ring formed by the concentrator lens and changes a circular luminous ring to a larger kidney shape luminous profile.

Reflected rays from mirror 55 onto panel 77 are not shown in FIG. 16*c* for clarity. However the apparent diameter of the sun as viewed from earth is larger than the diameter of lens 666 therefore radiation outside the lens diameter will be reflected by mirror 55 onto panel 77. The concentration of reflected rays increases the electrical current by 2.5 times minimum.

The invention is further demonstrated by means of the following embodiments, which are given for purpose of supporting the content of the disclosure only and are not meant to limit the invention to the particular mirror and lenses disclosed. Outlined below are some examples of deployments according to embodiments of this invention.

Exemplary Scenario 1: In the embodiments of the invention presented supra, a variety of configurations have been described for the concentrating lens, conical reflective mirror and flat round PV solar panels. Common to all has been the absence of active thermal management for the PV solar panels which would add cost and complexity to the solar power generator. Within the above embodiments no active heat management in respect of the PV solar panels has been provided during operation between five and twenty suns. The increase in electrical current by apparatus 1 is at least four times (e.g. from 1.3 amps to 4.0 amps) more by mirror 5 and two times (e.g. from 1.3 amps to 2.7 amps) more by lens 6. Power production is at least double (e.g. from 400 watts hour to 800 watts hour) daily from a comparable planar surface area. Factors like optical train misalignment, tracker accuracy, variation in loads and effects of environment have been taken into account for electrical power production.

An exhaust fan is incorporated into the present apparatus according to embodiments of the invention to prevent warm humid air condensation on the internal wall of clear dome 2 and on the optical components in cooler days. Exhaust fan 22 withdraws the warm air through post 4 and also keeps the temperature inside the dome lower for more efficient operation. For the PV solar panel, only passive heat sinking is provided by metal center disc 7*i* and aluminum back plate 7*g*.

Exemplary Scenario 2: Apparatus 1 provides for substantial increase in electrical output power per unit area of the PV solar panel when compared to non-concentrated planar PV panels. Beneficially the present solar power generators as taught by virtue of their azimuth-altitude tracking follow the sun so that the PV solar panels present their fullest aspects such that electrical power output during a sunny day is increased by at least two times with respect to fixed planar PV panels occupying the same planar surface area. The intermittent rotations will alternate automatically between two control modes depending on the sun visibility. Evidence demonstrates that twelve sided conical mirror 5 increases the electrical current instantaneously by three times (from 1.3 amps to 4.0 amps) and four ring circular lens 6 increases the electrical current instantaneously by one time (from 1.3 amps to 2.7 amps). The beneficial total increase in electrical current by the present optical configuration is from 1.3 amps to 6.7 amps. The amount of power produced by a compact size apparatus 1 is at least double, 800 watts hour per day compared to 400 watts hour per day with a 60 watts fixed conventional flat silicone PV panel that occupies the same planar surface area when factors like optical train misalignment, tracker accuracy, variation in loads and effects of environment have been taken into account for electrical power production.

Exemplary Scenario 3: Apparatus 1 is produced at low cost with most economical standard common materials. Solar panel 7 is made with standard and commonly available mono or poly crystalline silicon cells of 300 micron thickness. Conical mirror 5 is made with aluminum coated PETG sheets and polyisocyanurate insulation boards. Lens 6 is injection molded with PETG, SAN, vinyl, acrylic or polycarbonate polymers. Conical frame 11 is made of aluminum. Base 3 is made of plastics structural foam or aluminum. Post 4 is made of aluminum. Clear Dome 2 is thermoformed from PETG, SAN, vinyl or polycarbonate sheet.

Exemplary Scenario 4: As evidenced due to the double convex geometry, lens 6, 66 or 666 reduces shadows created onto solar panel by 75% from obstructions of nearby objects such as tree branches, leaves and poles. Therefore the impact on drop of electrical current during concentration while there is shadow by nearby obstructions is substantially reduced.

Exemplary Scenario 5: Lens 6 is replaced by lens 66 in apparatus 1 to make a compact apparatus with substantial increase in electrical current. The separation distance between the lens and the solar panel is reduced and the semi ephorical clear dome is made smaller than of apparatus 1.

Exemplary Scenario 6: Evidence shows that the results outlined below were achieved using a concentrator lens 666 of 164 mm diameter. The design of lens 666 being shown as having top convex arc of 80 mm radius and bottom convex arc of 490 mm radius, 8.3 mm thickness between apexes of both convex arcs, central and outer mounting ring thickness of 3.6 mm.

With a tilt of double convex lens 666 by twenty five degrees on a 45 mm diameter mono crystalline silicon PV solar panel 77 with a separation of 440 mm the short circuit current from PV solar panel 77 was 320 mA compared to 80 mA without the lens at 2.0V-2.3V. Solar panel 77 was made with four small rectangular mono crystalline silicon cells connected in series. This 4 times increase of electrical current by the lens strongly indicates that the benefit of using multi-junction cells for the solar panel will even be greater for higher total current and total voltage output.

With lens 666 such as described supra in conjunction with a six sided flat reflective smaller conical mirror 55 shown in FIG. 16*b* that has a slope length of two times the diameter of solar panel 77 at 90 mm forming a truncated cone yielded short circuit current of 520 mA compared to 80 mA under same sun conditions without cooling.

As evidenced the total current is increased by 6.5 times with the lens and mirror. It also means that such configuration with the lens alone can provide a compact LCPV concentrator without a conical mirror with a minimum of 4 times increase in current using multi-junction cells.

Lens 666 characterized by third and fourth dimensions along the same axes as the first and second dimensions of solar panel 77 respectively, wherein both the third and fourth dimensions are larger than the corresponding first and second dimension by about 300% and in operation the lens has a smaller separation from the solar panel compared to apparatus 1 and the plane of the lens is further offset by a 25° tilt with respect to plane B-B of PV solar panel 77. The clear semi-spherical dome of the module is smaller in diameter compared to apparatus 1 for greater compactness. It is expected that the total current will be increased by a minimum of 6.5 times if conical mirror 55 is used in conjunction with lens 666 on a multi-junction PV panel 77.

A 25 degree tilted double convex lens 666 indoors behind a dusty window yielded 75 mA versus 15 mA without the lens with a separation of 320 mm between lens and solar panel.

The effect of a double convex lens is to reduce the distance required between the solar panel and the lens by about 40% compared to using a plano convex lens for the same amount of current magnification. Lens 666 was orientated at an angle of approximately 25 degrees from the plane B-B parallel to solar panel 77.

Exemplary Scenario 7: Tilted double convex lens 666 with 440 mm separation between lens and 45 mm diameter solar panel yielded 90 mA behind windshield of inventor's car when compared to 22 mA without the lens. The same lens through window on foggy sunny day yielded 36.9 mA with a 250 mm separation; without the lens the short circuit current was 9.8 mA only.

Similarly, tilted lens 666 at a separation of 440 mm and tilt of 15 degrees yielded 130 mA compared to 40 mA without the lens when PV solar panel was connected to a battery charging circuit.

Tilted double convex lens 666 on 45 mm diameter solar panel 77 made up with four rectangular PV cell elements in parallel layout, wherein the middle pair of PV cell elements were blocked by shadow of a ⅝ inch thick window frame 40 inches away from solar panel; without the lens the solar panel yielded 1.8 mA but when the lens was added the current increased to 39 mA. It was noticed thai the shape of lens 666 reduces the width of the window frame shadow onto the PV panel by 75% allowing more concentrated sun rays to increase current. This nearby object shadow reduction phenomenon was confirmed also with nearby obstruction such as tree branches, leaves and poles.

The above-described embodiments of the present invention are intended to be examples only. Alterations, modifications and variations may be effected to the particular embodiments by those skilled in the art without departing from the scope of the invention, which is defined solely by the claims appended hereto.

What is claimed is:

1. An apparatus comprising:
a base for mounting a device perpendicularly to a structure or for insertion perpendicularly into the ground;
a turntable mounted upon the base with a conical frame assembly for mounting and alignment of a planar, circular solar panel and an optical assembly, the optical assembly comprised of a conical mirror and a lens; a pivot structure erected on the turntable for pivoting the conical frame assembly;
a biaxial sensor tracker and a biaxial controller for tracking a position of the sun and controlling both an azimuth mechanism and an altitude mechanism; the azimuth mechanism for adjusting a rotational position of the turntable and the conical frame assembly with respect to the base and the altitude mechanism for adjusting an elevation rotation of the conical frame assembly with respect to the turntable;
a plurality of mono-crystalline or poly-crystalline silicon photovoltaic (PV) cells forming the solar panel attached to a bottom of the conical frame assembly and responsive to incoming radiation within predetermined first and second solar ray wavelength ranges and characterized by first and second dimensions along axes perpendicular to one another in a plane parallel to a planar surface of the solar panel; an outer diameter of the solar panel is about 40% smaller than an outer diameter of the lens and about two times smaller than a slope length of the mirror; the solar panel rotates with the optical assembly while in operation;
the conical mirror having twelve sides, each side comprised of a panel, the conical mirror comprising an inner surface and an outer surface and having a first end disposed towards the solar panel and a distal end disposed towards the lens, the distal end comprising an outer diameter which is larger than any other diameter of the conical mirror, the first end of the mirror following a circle to closely match an outer perimeter formed by the PV cells of the solar panel; an inner surface of the conical mirror being reflective to radiation within the predetermined first wavelength range through a 6 inch air gap clearance between the outer diameter of the lens and the outer diameter of the distal end of the conical mirror; reflected rays through the air gap onto the conical mirror overlap the predetermined second wavelength range refracted by the lens onto the solar panel; wherein in operation the panel of each side of the conical mirror along which the first end and distal end are disposed are offset at a predetermined outward angle between 15° and 30° with respect to a perpendicular center axis going through a center of the lens and a center of the solar panel;
the lens positioned within the outer diameter of the distal end of the conical mirror and transmissible to a portion of the incoming radiation which is within the predetermined second wavelength range that falls within the predetermined first wavelength range area reflected by the conical mirror, the lens characterized by third and fourth dimensions along the axes perpendicular to one another in the plane parallel to the planar surface of the solar panel, wherein both the third and fourth dimensions are larger than the first and second dimensions, wherein in operation the lens has a predetermined separation from the solar panel and a plane of the lens is further transversely offset by a predetermined angle with respect to the planar surface of the solar panel; the lens is fixed and tilted permanently between 1° and 25° in relationship to the planar surface of the solar panel; the lens is composed of four double convex concentric rings sequentially stepped outward from the center of the lens;
an exhaust fan to remove water condensation inside the apparatus during cooler days operation;
a transparent environmental protective dome to protect against harsh weather, thermoformed from clear PETG (polyethylene terephthalate glycol), CAB (cellulose acetate butyrate), SAN (styrene acrylonitrile resin), co-polyester, vinyl, acrylic or polycarbonate sheet; the transparent dome is transmissible to solar radiation within the predetermined first wavelength range.

2. The apparatus according to claim 1 wherein:
the outer diameter of the solar panel is about 16 inches and the predetermined separation of the lens and the solar panel is about 19 inches.

3. The apparatus according to claim 1, wherein:
the conical mirror is a truncated conical mirror, wherein the twelve sides of the truncated conical mirror consist of six rectangular mirror panels alternating with six trapezoidal mirror panels; the first end of the conical mirror is about 1 to 2 mm from the outer perimeter of the PV cells forming the solar panel; the conical mirror height is no less than 22 inches;
the conical mirror is made with aluminum coated PETG sheets on ¾ inch thick polyisocyanurate foam insulation boards.

4. The apparatus according to claim 1, wherein:
the solar panel, conical mirror and lens form part of a permanently fixed aligned assembly that under direction of a tracker and controller rotate simultaneously according to a measure of time and a measure of sun position; wherein the controller will switch automatically back and forth between two control modes to follow the path of the sun, one mode for a visible sun and the other mode when the sun is not visible.

5. The apparatus according to claim 1, wherein:
cooling of the solar panel is absent of active temperature stabilization and active temperature management.

6. The apparatus to claim 1, wherein:
the lens is injection molded with PETG (polyethlene terephthalate glycol), CAB (cellulose acetate butyrate), SAN (styrene acrylonitrile resin), co-polyester, vinyl, acrylic or polycarbonate polymers.

7. The apparatus according to claim 1, wherein:
the base is made of ABS (acrylonitrile butadiene styrene) structural foam, vinyl plastics or aluminum; the base comprising of an aluminum post for mounting the apparatus perpendicularly to a structure or insertion perpendicularly into the ground;
the turntable is made of aluminum; the conical frame assembly is made of aluminum.

8. The apparatus according to claim 2, wherein:
a two control mode controller moves the conical frame assembly according to a measure of time and a measure of sun position; the first control mode senses the location of the sun and creates irregular intermittent daily horizontal (azimuth) and altitude (zenith) movements by bi-axial tracker electronics and two 24 hour programmable logic controllers when the sun is visible; the first control mode switches automatically to the second control mode when the sun is not visible and the intermittent daily horizontal (azimuth) and altitude (zenith) movements become regular short strokes created by the two 24 hour programmable logic controllers only to follow an average path of the sun between end of summer and end of spring;
the tracker electronics will follow the path of the sun at any point in time once the sun appears and cause the two control mode controller to switch back to the first control mode;
the azimuth and altitude mechanisms are driven with DC motors with rated torque less than 2 Newton centimeter and less than 100 milliamps.

9. The apparatus according to claim 8, wherein:
cooling of the solar panel is absent of active temperature stabilization and active temperature management and a passive heat sink is only required for the solar panel.

10. The apparatus according to claim 2, wherein:
the dome has a semi spherical shape.

* * * * *